(12) United States Patent
Ryu et al.

(10) Patent No.: US 10,387,276 B2
(45) Date of Patent: Aug. 20, 2019

(54) SEMICONDUCTOR MEMORY DEVICES WITH ERROR CORRECTION AND METHODS OF OPERATING THE SAME

(71) Applicant: Samsung Electronics Co., Ltd., Suwon-si, Gyeonggi-do (KR)

(72) Inventors: Ye-Sin Ryu, Seoul (KR); Jong-Wook Park, Suwon-si (KR); Youn-Hyung Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 199 days.

(21) Appl. No.: 15/596,540

(22) Filed: May 16, 2017

(65) Prior Publication Data

US 2018/0060194 A1   Mar. 1, 2018

(30) Foreign Application Priority Data

Sep. 1, 2016 (KR) .................. 10-2016-0112434

(51) Int. Cl.
| | |
|---|---|
| G11C 29/00 | (2006.01) |
| G06F 11/16 | (2006.01) |
| G06F 3/06 | (2006.01) |
| G06F 11/10 | (2006.01) |
| G11C 29/52 | (2006.01) |
| G11C 29/04 | (2006.01) |

(52) U.S. Cl.
CPC ........ *G06F 11/1666* (2013.01); *G06F 3/0604* (2013.01); *G06F 3/0659* (2013.01); *G06F 3/0679* (2013.01); *G06F 11/10* (2013.01); *G06F 11/108* (2013.01); *G06F 11/1048* (2013.01); *G11C 29/52* (2013.01); *G06F 2201/805* (2013.01); *G11C 2029/0411* (2013.01)

(58) Field of Classification Search
CPC .... G06F 11/1666; G06F 11/108; G06F 11/10; G06F 11/194; G06F 3/0604; G06F 3/0659; G06F 3/0679; G11C 29/52
See application file for complete search history.

(56) References Cited

U.S. PATENT DOCUMENTS

| | | |
|---|---|---|
| 7,102,549 B1 | 9/2006 | Keirn et al. |
| 7,447,948 B2 | 11/2008 | Galbi et al. |
| 8,245,099 B2 | 8/2012 | Lasser |
| 8,495,460 B2 | 7/2013 | Flynn et al. |
| 9,088,303 B2 | 7/2015 | Larsen et al. |
| 9,304,851 B2 | 4/2016 | Wu et al. |
| 2013/0326304 A1 | 12/2013 | Bueb et al. |

(Continued)

*Primary Examiner* — Samir W Rizk
(74) *Attorney, Agent, or Firm* — Myers Bigel, P.A.

(57) ABSTRACT

A method of operating a semiconductor memory device including a memory cell array and an error correction code (ECC) engine, wherein the memory cell array includes a plurality of memory cells and the ECC engine is configured to perform an error correction operation on data of the memory cell array, may include storing, in a nonvolatile storage, a mapping information indicating physical addresses of normal cells to swap with a portion of fail cells when a first unit of memory cells includes a number of the fail cells exceeding an error correction capability of the ECC engine. The first unit of memory cells of the memory cells may be accessed based on a logical address. The method may include performing a memory operation on the memory cell array selectively based on the mapping information.

19 Claims, 22 Drawing Sheets

(56) References Cited

U.S. PATENT DOCUMENTS

| | | | |
|---|---|---|---|
| 2015/0113342 A1* | 4/2015 | Jung | G11C 8/14 |
| | | | 714/721 |
| 2015/0228352 A1* | 8/2015 | Choi | G11C 29/76 |
| | | | 365/185.2 |
| 2016/0062830 A1 | 3/2016 | Cha et al. | |

* cited by examiner

SEMICONDUCTOR MEMORY DEVICES WITH ERROR CORRECTION AND METHODS OF OPERATING THE SAME

CROSS-REFERENCE TO RELATED APPLICATION(S)

This application claims priority under 35 U.S.C. § 119 to Korean Patent Application No. 10-2016-0112434, filed on Sep. 1, 2016 in the Korean Intellectual Property Office, the disclosure of which is incorporated by reference herein in its entirety.

BACKGROUND

1. Technical Field

Embodiments of the inventive concepts relate to memory devices, and more particularly, to semiconductor memory devices and methods of operating the same.

2. Discussion of the Related Art

A semiconductor memory device is a memory device which may be embodied using a semiconductor. Examples of such semiconductors include, silicon Si, germanium Ge, gallium arsenide GaAs, indium phosphide InP, etc. Semiconductor memory devices may be, classified into volatile memory devices and nonvolatile memory devices.

A volatile memory device may lose its stored data when its power supply is interrupted. Examples of volatile memory devices include static RAM (SRAM), dynamic RAM (DRAM), synchronous DRAM (SDRAM), etc.

A DRAM may include a plurality of memory cells arranged in a matrix form. As the integration and the speed of semiconductor memory devices increases, a ratio of cells of the semiconductor memory devices which are failed cells that do not operate correctly may increase.

SUMMARY

Some embodiments of the inventive concepts may provide methods of operating semiconductor memory devices, capable of enhancing performance.

Some embodiments of the inventive concepts may provide semiconductor memory devices with enhanced performance.

According to some embodiments of the inventive concepts, methods of operating semiconductor memory devices may be provided. A method of operating a semiconductor memory device including a memory cell array and an error correction code (ECC) engine, wherein the memory cell array includes a plurality of memory cells and the ECC engine is configured to perform an error correction operation on data of the memory cell array, may include storing, in a nonvolatile storage, a mapping information indicating physical addresses of normal cells to swap with a portion of fail cells when a first unit of memory cells includes a number of the fail cells exceeding an error correction capability of the ECC engine. The first unit of memory cells of the memory cells may be accessed based on a logical address. The method may include performing a memory operation on the memory cell array selectively based on the mapping information.

According to some embodiments of the inventive concepts, methods of operating semiconductor memory devices may be provided. A method of operating a semiconductor memory device including a memory cell array and an error correction code (ECC) engine, wherein the memory cell array includes a plurality of memory cells and the ECC engine is configured to perform an error correction operation on data in the memory cell array, may include storing, in a nonvolatile storage, a mapping information indicating physical addresses of normal cells capable of swapping with a portion of fail cells when a first unit of memory cells includes a number of the fail cells exceeding an error correction capability of the ECC engine. The first unit of memory cells of the memory cells may be accessed based on a logical address. The method may include prefetching a second unit of data from a second unit of memory cells. The second unit of memory cells may include a plural number of the first unit of memory cells. The method may include re-arranging the second unit of data based on the mapping information such that each of first units of data included in the second unit of data includes no more than a number of errors within the error correction capability of the ECC engine. The method may include providing the ECC engine with at least two of the first units of data of the second unit of data. The method may include performing, in the ECC engine, an ECC operation on the at least two of the first units of data.

According to some embodiments of the inventive concepts, semiconductor memory devices are provided. A semiconductor memory device may include a memory cell array, an error correction code (ECC) engine, an address control circuit, an address decoder and a control logic circuit. The memory cell array may include a plurality of memory cells. The ECC engine may be configured to perform an error correction operation on data of the memory cell array. The address control circuit may be configured to store a mapping information indicating physical addresses of normal cells to swap with a portion of fail cells when a first unit of memory cells includes a number of the fail cells exceeding an error correction capability of the ECC engine. The first unit of memory cells of the memory cells may be accessed based on a logical address. The address decoder may be configured to access the memory cell array selectively based on the mapping information. The control logic circuit may be configured to control the ECC engine, the address control circuit and the address decoder in response to a command and an address provided from a device external to the semiconductor device.

According to some embodiments of the inventive concepts, methods of operating semiconductor memory devices may be provided. A method of operating a semiconductor memory device may include receiving an access address. The method may include determining that the access address is stored within mapping information. The method may include selecting one of the access address or a swapping address of the mapping information corresponding to the access address based on the determining that the access address is stored within mapping information. The method may include accessing memory cells of the semiconductor memory device based on the selected one of the access address or the swapping address.

BRIEF DESCRIPTION OF THE DRAWINGS

The inventive concepts will become more in view of the detailed description and the accompanying drawings.

DETAILED DESCRIPTION OF THE EMBODIMENTS

Figure 1:
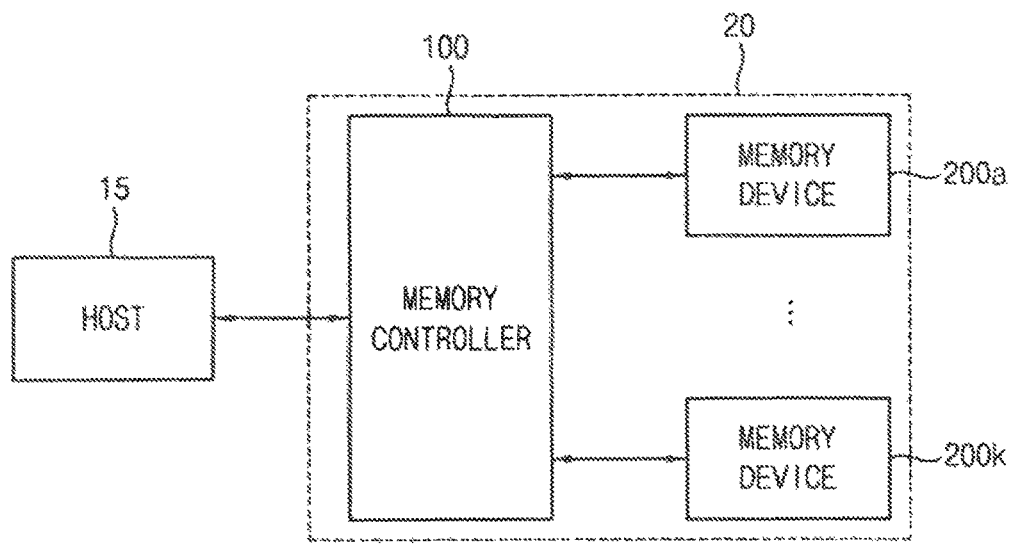
FIG. 1 is a block diagram illustrating an electronic system according to some embodiments of the inventive concepts.

The inventive concepts will be described more fully hereinafter with reference to the accompanying drawings, in which some embodiments are shown. The inventive concepts and methods of achieving them will be apparent from the following embodiments that will be described in more detail with reference to the accompanying drawings. The embodiments of the inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments may be described with reference to illustrations that include elements that are similar to or the same as like elements that are previously described with respect to previous illustrations. Reference numerals the same as or similar to those described with respect to the figures may represent the same or similar elements, and descriptions thereof may be omitted or briefly described in the description in order to simplify the description.

FIG. 1 is a block diagram illustrating an electronic system according to some embodiments of the inventive concepts.

Referring to FIG. 1, an electronic system 10 may include a host 15 and a memory system 20. The memory system 20 may include a memory controller 100 and a plurality of semiconductor memory devices 200a~200k.

In some embodiments, the host 15 may communicate with the memory system 20 through various interface protocols such as, for example, Peripheral Component Interconnect-Express (PCI-E), Advanced Technology Attachment (ATA), Serial ATA (SATA), Parallel ATA (PATA), and/or serial attached SCSI (SAS). In some embodiments, the host 15 may communicate with the memory system 20 through interface protocols such as, for example, Universal Serial Bus (USB), Multi-Media Card (MMC), Enhanced Small Disk Interface (ESDI), and/or Integrated Drive Electronics (IDE).

The memory controller 100 may control an overall operation of the memory system 20. The memory controller 100 may control an overall data exchange between the host 15 and the plurality of semiconductor memory devices 200a~200k. For example, the memory controller 100 may write data in the plurality of semiconductor memory devices 200a~200k and/or read data from the plurality of semiconductor memory devices 200a~200k in response to request from the host 15.

In addition, the memory controller 100 may issue operation commands to the plurality of semiconductor memory devices 200a~200k for controlling the plurality of semiconductor memory devices 200a~200k.

In some embodiments, ones of the plurality of semiconductor memory devices 200a~200k may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc. in some embodiments, ones of the plurality of semiconductor memory devices 200a~200k may be a may be a memory device including resistive type memory cells such as a magnetoresistive random access memory (MRAM), a resistive random-access memory (RRAM), a phase change random access memory (PRAM) a ferroelectric random access memory (FRAM), etc.

An MRAM may be, a nonvolatile computer memory based on magnetoresistance. An MRAM may be different from a volatile RAM, For example, a nonvolatile MRAM may retain all stored data even when power is turned off.

Although some nonvolatile RAM may be generally slower than a volatile RAM, an MRAM may have read and write response times comparable with read and write response times of a volatile RAM. Unlike a conventional RAM that stores data as electric charge, an MRAM may store data by using magnetoresistance (or magnetoresistive) elements. In general, a magnetoresistance element may be made of two magnetic layers, each having a magnetization.

An MRAM may be a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon may use a method in which when a spin-polarized current flows in one direction, a magnetization direction of the magnetic layer may be changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or in anti-parallel. In at least one example embodiment, if the magnetization directions of the two magnetic layers are parallel, a resistance between the two magnetic layers may be in a low ("0") state. If the magnetization directions of the two magnetic layers are anti-parallel, a resistance between the two magnetic layers may be in a high ("1") state. Switching of the magnetization direction of the free layer and the high or low state of the resistance between the two magnetic layers may result in write and read operations of the MRAM.

An MRAM may be an all-round memory device that may have low cost and has high capacity (like a dynamic random access memory (DRAM), may operate at high speed (like a static random access memory (SRAM), and may be nonvolatile (like a flash memory).

Figure 2:
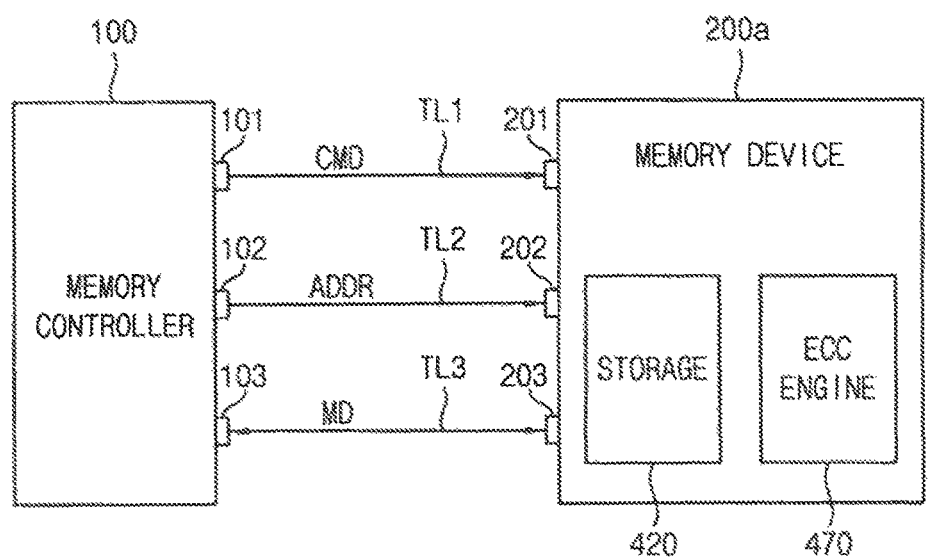
FIG. 2 is a block diagram illustrating a memory system of the electronic system of FIG. 1 according to some embodiments of the inventive concepts.

FIG. 2 is a block diagram illustrating a memory system of the electronic system of FIG. 1 according to some embodiments of the inventive concepts.

In FIG. 2, only one semiconductor memory device 200a in communication with the memory controller 100 is illustrated for convenience. However, the details discussed herein related to semiconductor memory device 200a may equally apply to the other semiconductor memory devices 200b~200k.

Referring to FIG. 2, the memory system 20 may include the memory controller 100 and the semiconductor memory device 200a. Each of the memory controller 100 and the semiconductor memory device 200a may be formed as a separate semiconductor chip or as a separate group of chips (e.g., semiconductor memory device 200a may include a stack of semiconductor chips in a semiconductor package). The memory controller 100 and the semiconductor memory device 200a may be connected to each other through corresponding command pins 101 and 201, corresponding address pins 102 and 202 and corresponding data pins 103 and 203. The command pins 101 and 201 may transmit a command signal CMD through a command transmission line TL1, the address pins 102 and 202 may transmit an address signal ADDR through an address transmission line 112, and the data pins 103 and 203 may exchange data MD through a data transmission line TL3.

Referring to FIGS. 1 and 2, the memory controller 100 may input data to the semiconductor memory device 200a and/or may output data from the semiconductor memory device 200a through the data pins 103 and 203 based on the request from the host 15. In addition, the semiconductor memory device 200a may receive address from the memory controller 100 through the address pins 102 and 202.

The semiconductor memory device 200a may include a nonvolatile storage 420 and an error correction code (ECC) engine 470. The ECC engine 470 may perform ECC operations on data of a memory cell array of the semiconductor memory device 200a. The ECC operations may include ECC encoding and/or ECC decoding. The nonvolatile storage 420 may store a mapping information indicating a physical address of normal cells to swap a portion of fail cells when a first unit of memory cells include a number of the fail cells exceeding error correction capability of the ECC engine 470. The first unit of memory cells of the memory cells may be accessed based on a logical address. The mapping information may include a fail row address and a fail column address of a fail cell to be swapped. The mapping information may include a mapping address of a normal cell to swap with the fail cell. In some embodiments, the mapping information may be stored in the nonvolatile storage 420 through a test on the memory cells during fabrication process of the semiconductor memory device 200a. In some embodiments, the mapping information may be stored in the nonvolatile storage 420 through setting a mode register included in the semiconductor memory device 200a. The mapping address may be addresses of memory cells to swap the portion of the fail cells such that the first unit of memory cells includes errors within the error correction capability of the ECC engine 470.

In some embodiments, the mapping address may be stored in the nonvolatile storage 420 through a test on the memory cells based on distribution of the fail cells during fabrication process of the semiconductor memory device 200a. In some embodiments, the mapping address may be randomly stored in the nonvolatile storage without regard to distribution of the fail cells during power-up sequence of the semiconductor memory device 200a. When the mapping address is randomly stored in the nonvolatile storage without regard to distribution of the fail cells, a probability that a number of the fail cells in the first unit of memory cells exceed the error correction capability may be reduced.

Figure 3:
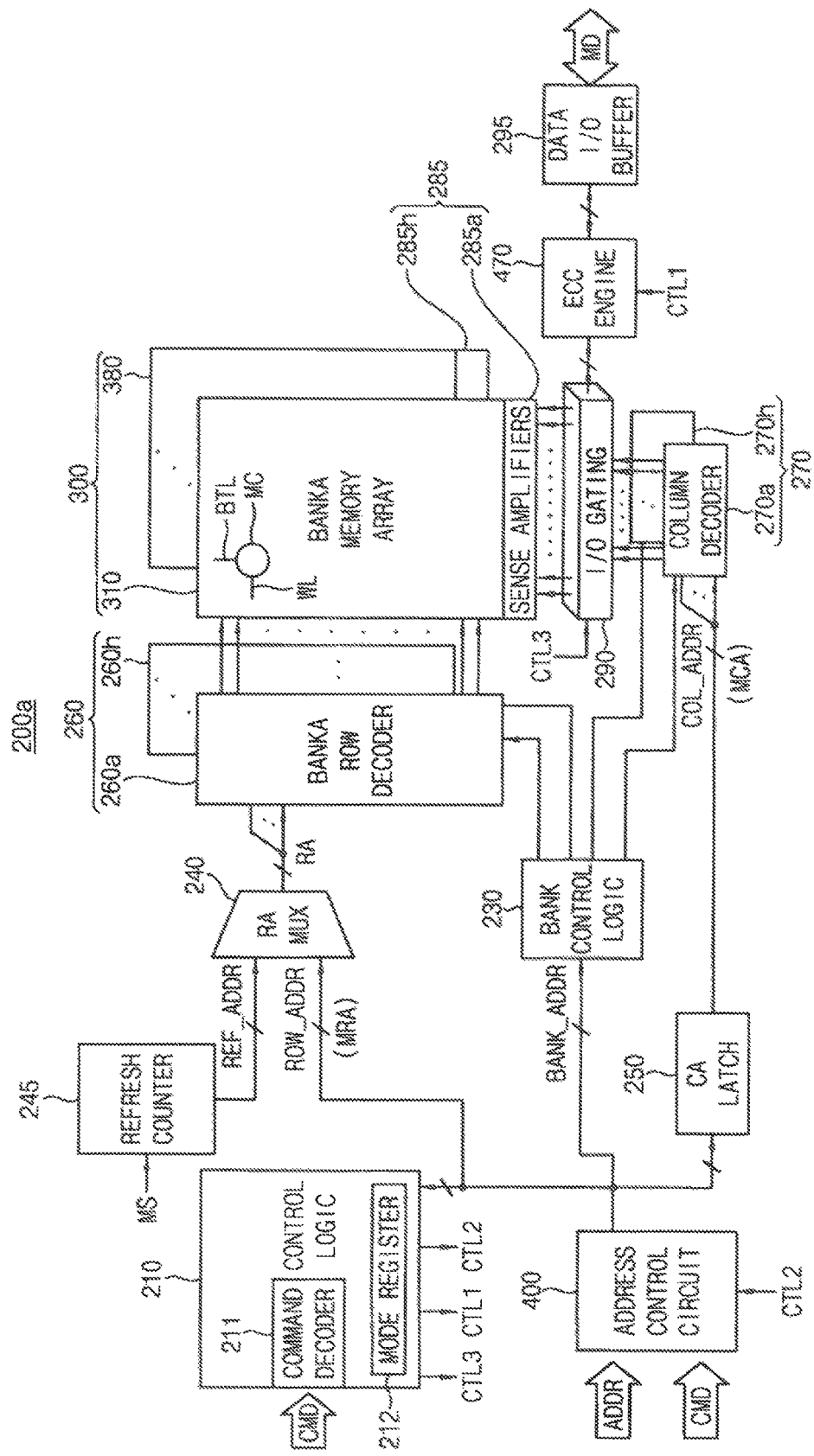
FIG. 3 is a block diagram illustrating an example of a semiconductor memory device of the memory system of FIG. 2 according to some embodiments of the inventive concepts.

FIG. 3 is a block diagram illustrating an example of a semiconductor memory device of the memory system of FIG. 2 according to some embodiments of the inventive concepts.

Referring to FIG. 3, the semiconductor memory device 200a may include a control logic circuit 210, an address control circuit 400, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, a refresh counter 245 and an ECC engine 470.

The memory cell array 300 may include first through eighth hank arrays 310~380. The row decoder 260 may include first through eighth bank row decoders 260a~260h respectively coupled to the first through eighth hank arrays 310~380, the column decoder 270 may include first through eighth bank column decoders 270a~270h respectively coupled to the first through eighth hank arrays 310~380, and the sense amplifier unit 285 may include first through eighth bank sense amplifiers 285a~285h respectively coupled to the first through eighth hank arrays 310~380. The first through eighth hank arrays 310~380, the first through eighth bank row decoders 260a~260h, the first through eighth bank column decoders 270a~270h and first through eighth bank sense amplifiers 285a~285h may form first through eighth banks. Each of the first through eighth hank arrays 310~380 may it a plurality of memory cells MC coupled to word-lines WL and bit-lines BTL.

Although the semiconductor memory device 200a is illustrated in FIG. 3 as including eight banks, in some embodiments, the semiconductor memory device 200a may include any number of banks.

The address control circuit 400 may receive an address ADDR including a bank address BANK_ADDR, a row address ROW_ADDR and a column address COL_ADDR and the command CMD from the memory controller 100.

The address control circuit 400 may provide the received bank address BANK_ADDR to the bank control logic 230, may provide the received row address ROW_ADDR or a mapped row address MRA changed from the row address ROW_ADDR to the row address multiplexer 240, and may provide the received column address COL_ADDR or a mapped column address CRA changed from the column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR or the mapped row address MRA from the address control circuit 400, and may receive a refresh row address REF_ADDR from the refresh counter 245. The row address multiplexer 240 may selectively output one of the row address ROW_ADDR and the mapped row address MRA or the refresh row address REF_ADDR as a row address RA. The row address RA that is output from the row address multiplexer 240 may be applied to the first through eighth bank row decoders 260a~260h.

The activated one of the first through eighth bank row decoders 260a-260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR or the mapped column address MCA from the address control circuit 400, and may temporarily store the received column address COL_ ADDR or the mapped column address MCA. In some embodiments, in a burst mode, the column address latch 250 may generate column addresses that increment from the received column address COL_ADDR or the mapped column address MCA. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the input/output gating circuit 290 in order to output data corresponding to the column address COL_ADDR or the mapped column address MCA.

The I/O gating circuit 290 may include, circuitry for gating input/output data. The I/O gating circuit 290 may further include read data latches for storing data that is output from the first through eighth bank arrays 310~380, and write drivers for writing data to the first through eighth bank arrays 310~380.

Data to be read from one bank array of the first through eighth bank arrays 310~380 may be sensed by a sense amplifier coupled to the one hank array from which the data is to be read, and may be stored in the read data latches. The data stored in the read data latches may be ECC-decoded by the ECC engine 470 and may be provided to the memory controller 100 via the data I/O buffer 295. Data MD to be written in one hank array of the first through eighth bank arrays 310~380 may be provided to the data I/O buffer 295 from the memory controller 100. The MD may be ECC-encoded by the ECC engine 470 and may be provided to the write driver. The write driver may write the data MD in one bank array of the first through, eighth bank arrays 310~380.

The control logic circuit 210 may control operations of the semiconductor memory device 200a. For example, the control logic circuit 210 may generate control signals for the semiconductor memory device 200a in order to perform a write operation and/or a read operation. The control logic circuit 210 may include a command decoder 211 that may decode a command CMD received from the memory controller 100 and a mode register 212 that may set an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 may generate a first control signal CTL1 to control the ECC engine 470, a second control signal CTL2 to control the address control circuit 400 and a third control signal CTL3 to control the I/O gating circuit 290. The control logic circuit 210 may control the row decoder 260 and the column decoder 270. The row decoder 260 and the column decoder 270 may be collectively referred to as an address decoder.

The ECC engine 470 may perform an ECC encoding on data to be stored in the memory cell array 300 to generate parity data in response to the first control signal CTL1, may store the data in a first region (a normal cell region) of the memory cell array 300 and may store the parity data in a second region (a parity cell region) of the memory cell array 300. The ECC engine 470 may perform an ECC decoding on data read from the memory cell array 300 in response to the first control signal CTL1 and may correct at least one error if the read data includes the error. The ECC encoding and the ECC decoding may be referred to as ECC operations.

When the ECC engine 470 performs an ECC operation, the address control circuit 400, the row decoder 260 and the column decoder 220 may map addresses of a portion of the fail cells to distribute logical locations of the fail cells such that the first unit of memory cells includes errors within the error correction capability of the ECC engine 470.

FIGS. 4A to 4E are circuit diagrams of some implementations of a memory cell of the semiconductor memory device of FIG. 3 according to some embodiments of the inventive concepts.

Figure 4A:
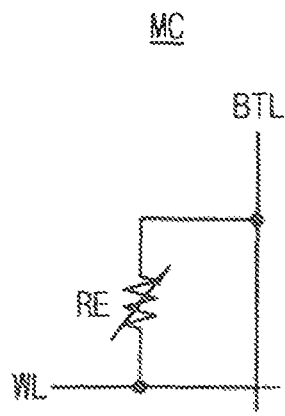
FIGS. 4A to 4E are circuit diagrams of some implementations of a memory cell of the semiconductor memory device of FIG. 3 according to some embodiments of the inventive concepts.
Figure 4B:
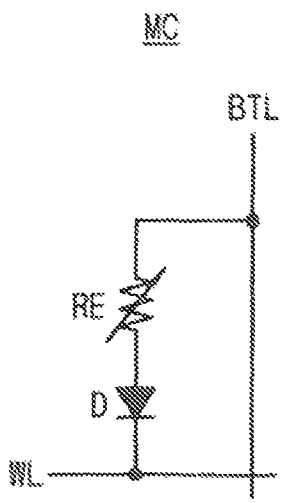
Figure 4C:
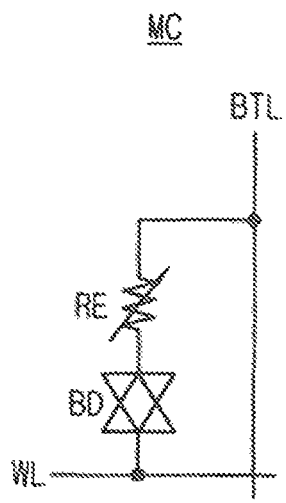
Figure 4D:
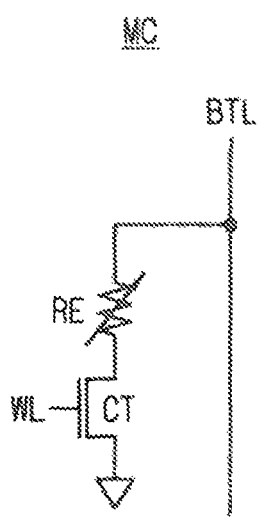
Figure 4E:
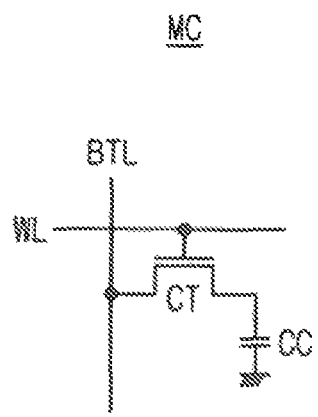

FIGS. 4A to 4D illustrate memory cells MC which are implemented with resistive type memory cells and FIG. 4E illustrates a memory cell MC which is implemented with a dynamic memory cell.

FIG. 4A illustrates a resistive type memory cell without a selection element, while FIGS. 4B to 4D show resistive type memory cells each comprising a selection element.

As shown in FIG. 4A, a memory cell MC may include a resistive element RE connected to a bit-line BM and a word-line L. Such a resistive memory cell having a structure without a selection element may store data by a voltage applied between bit-line BL and word-line WL.

As shown in FIG. 4B, a memory cell MC may include a resistive element RE and a diode D. The resistive element RE may include a resistive material for data storage. The diode D may be a selection element (or switching element) that supplies current to resistive element RE or cuts off the current supply to resistive element RE according to a bias of word-line WL and bit-line BTL. The diode D may be coupled between the resistive element RE and word-line WL, and the resistive element RE may be coupled between the bit-line BTL and the diode D. Positions of the diode D and the resistive element RE may be interchangeable. The diode D may be turned on or turned off by a word-line voltage. Thus, a resistive memory cell may be not driven where a voltage of a constant level or higher is supplied to an unselected word-line WL.

As shown in FIG. 4C, a memory cell MC may include a resistive element RE and a bidirectional diode BD. The resistive element R may include a resistive material for data storage. The bidirectional diode BD may be coupled between the resistive element RE and a word-line WL, and the resistive element RE may be coupled between a BTL and the bidirectional diode BD. Positions of the bidirectional diode BD and the resistive element RE may be interchangeable. The bidirectional diode BD may block leakage current flowing to an unselected semiconductor memory cell.

As shown in FIG. 4D, a memory cell MC may include a resistive element RE and a transistor CT. The transistor CT may be a selection element (or switching element) that supplies current to the resistive element RE or cuts off the current supply to the resistive element RE according to a voltage of a word-line WL. The transistor CT may be coupled between the resistive element RE and the word-line WL, and the resistive element RE may be coupled between a bit-line BTL and the transistor CT. Positions of the transistor CT and the resistive element RE may be interchangeable. The semiconductor memory cell may be selected or unselected depending on whether the transistor CT driven by word-line WL is turned on or turned off.

As shown in FIG. 4E, a memory cell MC may include a cell capacitor CC and a transistor CT. The transistor CT may be a selection element (or switching element) that connects/disconnects the cell capacitor CC to/from bit-line BTL according to a voltage of a word-line WL. The transistor CT may be coupled between the cell capacitor CC, a word-line WL and a bit-line BTL, and the cell capacitor CC may be coupled between the transistor CT and a plate voltage.

Figure 5:
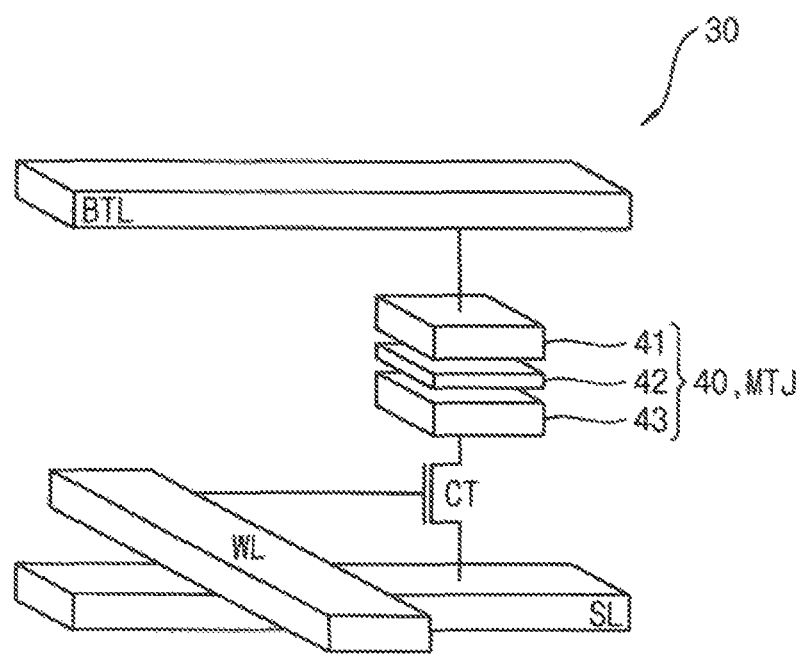
FIG. 5 is a block diagram illustrating a memory cell of the semiconductor memory device of FIG. 3 according to some embodiments of the inventive concepts.

FIG. 5 is a block diagram illustrating a memory cell of the semiconductor memory device of FIG. 3 according to some embodiments of the inventive concepts.

Referring to FIG. 5, an STT-MRAM cell 30 may include a MTJ element 40 and a cell transistor CT. A gate of the cell transistor CT may be connected to a word-line WL and one electrode of the cell transistor CT may be connected through the MTJ element 40 to a bit-line BTL. The other electrode of the cell transistor CT may be connected to a source line SL.

The MTJ element 40 may include a free layer 41, a pinned, layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer may be further provided.

In order to perform a write operation of the STT-MRAM cell 30, a logic high voltage may be applied, to the word-line WL to turn on the cell transistor CT. A program current, for example, a write current may be applied to the bit-line BTL and the source line SL. A direction of the write current may be determined by a logic state of the MTJ element 40.

In order to perform a read operation of the STT-MRAM cell 30, a logic high voltage may be applied to the word-line WL to turn on the cell transistor CT, and a read current may be supplied to the bit-line BTL and the source line SL. Accordingly, a voltage may be developed at both ends of the MTJ element 40, may be detected by the sense amplifier 285a, and may be compared with a reference voltage from a reference voltage to determine a logic state of the MTJ element 40. Accordingly, data stored in the MTJ element 40 may be detected.

Figure 6:
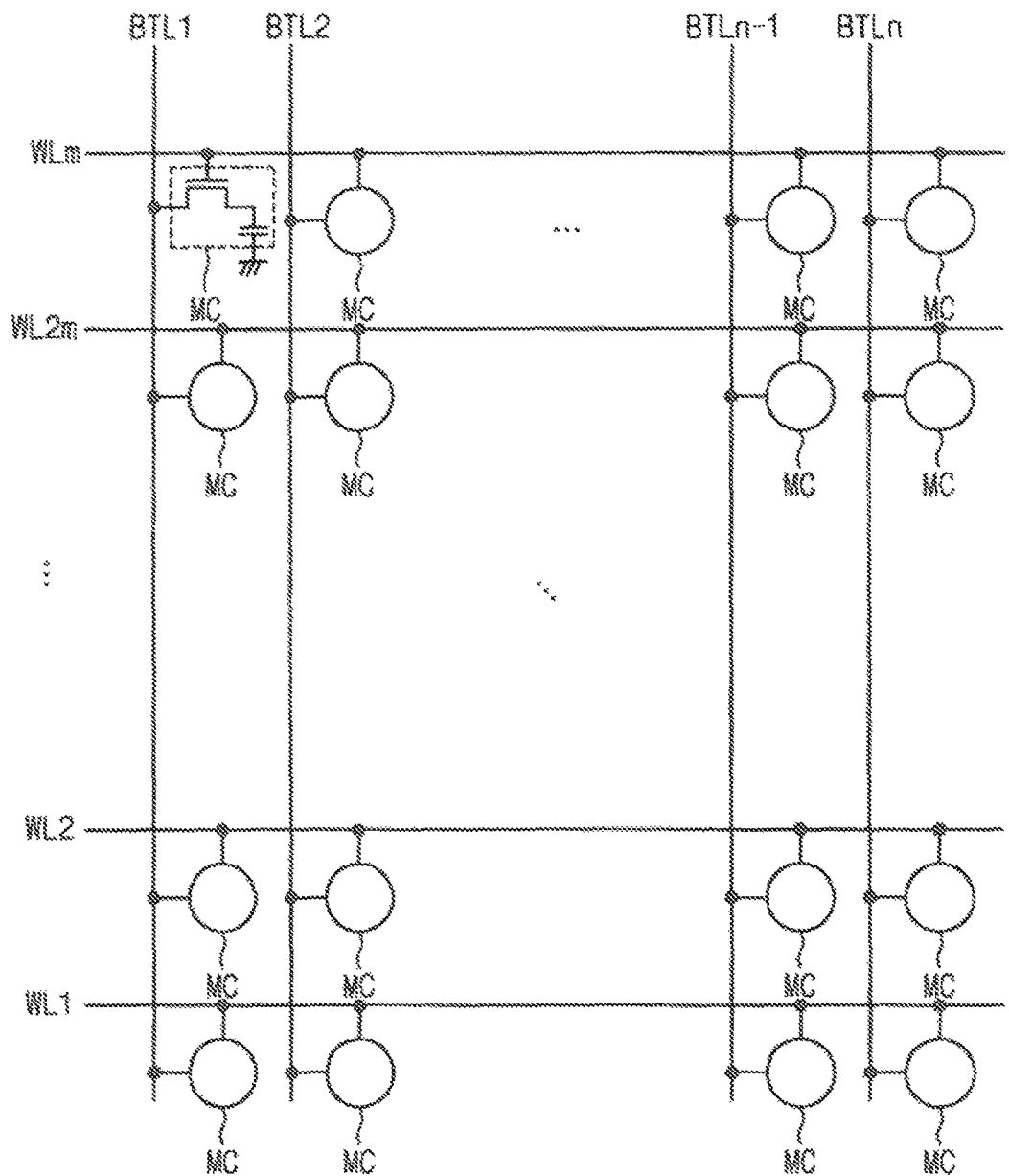
FIG. 6 illustrates a first bank array of the semiconductor memory device of FIG. 3 according to some embodiments of the inventive concepts.

FIG. 6 illustrates a first bank array of the semiconductor memory device of FIG. 3 according to some embodiments of the inventive concepts.

Referring to FIG. 6, the first bank array 310 may include a plurality of word-lines WL1~WLm (m being a natural number greater than two), a plurality of bit-lines BTL1~BTLn (a being a natural number greater than two), and a plurality of memory cells MCs disposed near intersections between the word-lines WL1~WL2m and the bit-lines BTL1~BLTn. In some embodiments, each of the plurality of memory cells MCs may include a dynamic random access memory (DRAM) cell structure. The plurality of word-lines WL1~WLm to which the plurality of memory cells MCs are connected may be defined as rows of the first bank array 310 and the plurality of bit-lines BTL1~BTLn to which the plurality of memory cells MCs are connected may be defined as columns of the first bank array 310.

Figure 7:
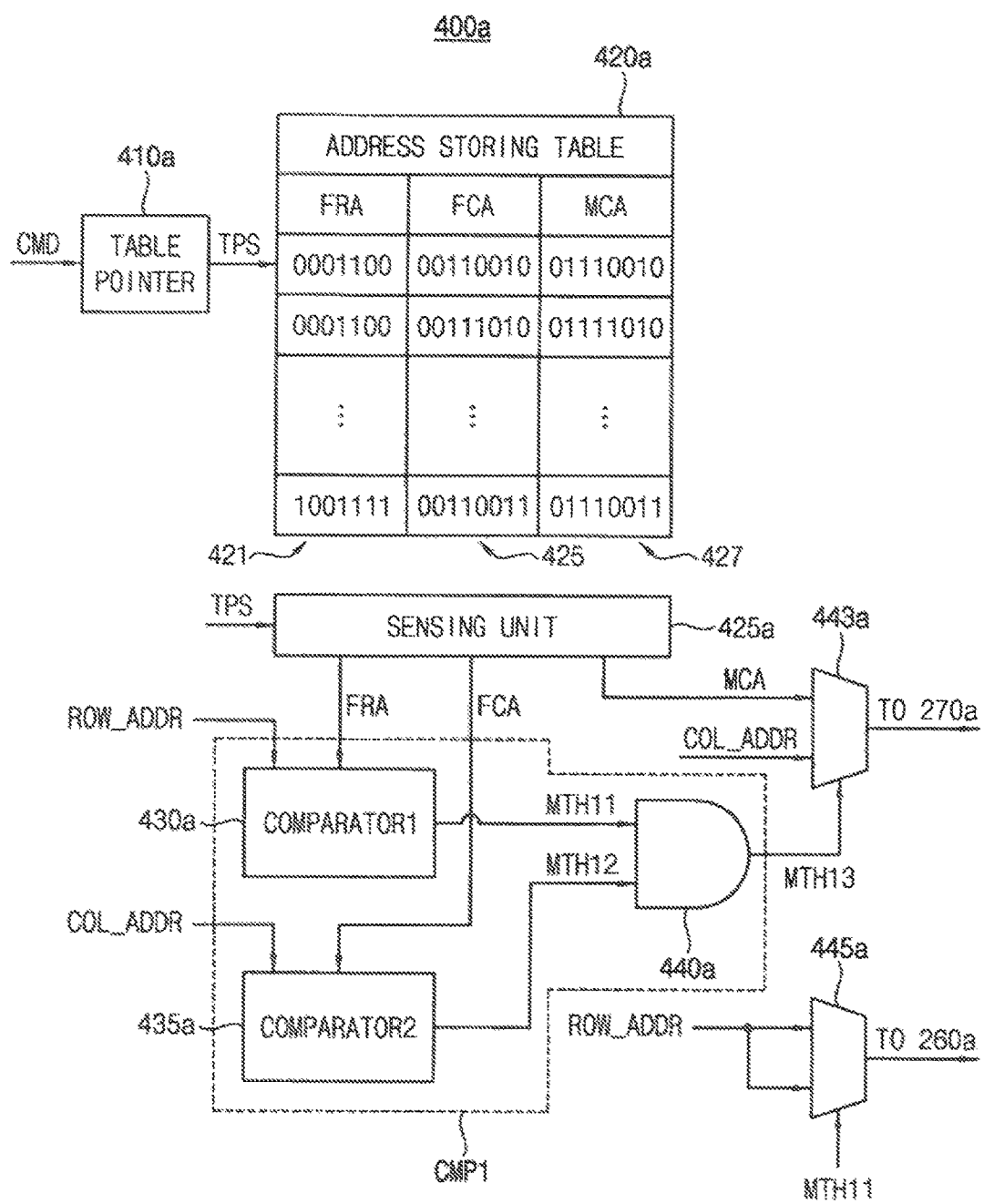
FIG. 7 is a circuit diagram illustrating an address control circuit of the semiconductor memory device of FIG. 3 according to some embodiments of the inventive concepts.

FIG. 7 is a circuit diagram illustrating an address control circuit of the semiconductor memory device of FIG. 3 according to some embodiments of the inventive concepts.

Referring to FIG. 7, an address control circuit 400a may include a table pointer 410a, a nonvolatile storage 420a, a sensing unit 425a, a comparator circuit CMP1, a first selection circuit 443a and a second selection circuit 445a. The nonvolatile storage 420a may be referred to as an address storing table.

The table pointer 410a may generate a pointer signal TPS in response to the command CMD designating a write operation and a read operation. The pointer signal TPS may provide location information for the address storing table 420a.

The address storing table 420a may include a first storing unit 421, a second storing unit 425 and a third storing unit 427. The first storing unit 421 may store a fail row address FRA of the fail cell, the second storing unit 425 may store a fail column address FCA of the fail cell and the third storing unit 427 may store a mapped column address MCA of a memory cell to swap the fail column address FCA of the fail cell.

The address storing table 420a may be implemented as an anti-fuse array or a content addressable memory (CAM). The sensing unit 425a may output a fail row address FRA, a fail column address FCA and a mapped column address MCA stored in a location (indicated by the pointer signal TPS) in the address storing table 420a in response to the pointer signal TPS. When the first unit of memory cells of a memory cell row, accessed by a logical address includes a number of fail cells exceeding the error correction capability of the ECC engine 470, the address storing table 420a may store a row address of the memory cell row as the fail row address FRA, and may store column addresses of a portion of the fail coils to be swapped with other memory cells as the fail column addresses FCA. The address storing, table 420a may map a logical column address of a fail cell to a physical column address of a swapping memory cell.

The comparator circuit CMP1 may include a first comparator 430a, a second comparator 435a and an AND gate 440a.

The first comparator 430a may compare the fail row address FRA and an accessed row address ROW_ADDR and may output a first match signal MTH11 indicating whether the fail row address FRA and the row address ROW_ADDR are same. The second comparator 435a may compare the fail column address FCA and an accessed column address COL_ADDR and may output a second match signal MTH12 indicating whether the fail column address FCA and the column address COL_ADDR are same. The AND gate 440a may perform an AND operation on the first match signal MTH11 and the second match signal MTH12 to output a third match signal MTH13. The first selection circuit 443a may output one of the mapped column address MCA and the column address COL_ADDR in response to the third match signal MTH13 to the first column decoder 270a. The second selection circuit 445a may output the row address ROW_ADDR in response to the first match signal MTH11 to the first row decoder 260a.

Therefore, the first selection circuit 443a may output the mapped column address MCA to the first column decoder 270a when the fail row address FRA and the row address ROW_ADDR are same and the fail column address FCA and the column address COL_ADDR are same. Otherwise, the first selection circuit 443a may output the column address COL_ADDR to the first column decoder 270a.

When the first selection circuit 443a outputs the mapped column address MCA to the first column decoder 270a, the first column decoder 270a may select a memory cell designated by the mapped column address MCA instead of a memory cell designated by the fail column address FCA, of memory cells in a memory cell row designated by the fail row address FRA. Therefore, the first unit of memory cells may include fail cells within the error correction capability of the ECC engine because memory locations of the fail cells are distributed in a physical address region.

Figure 8:
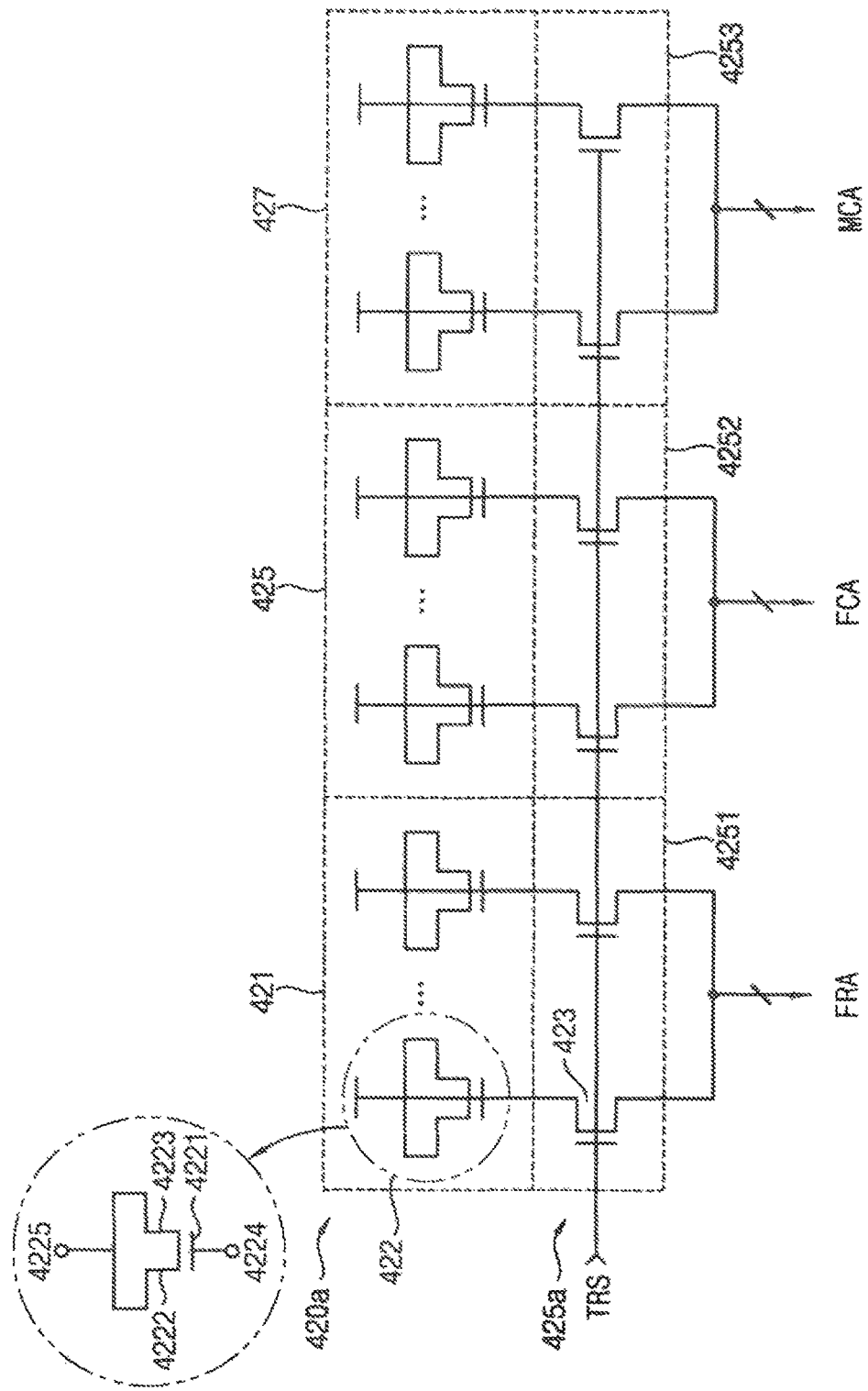
FIG. 8 is a circuit diagram illustrating an address storing table of the address control circuit of FIG. 7 according to some embodiments of the inventive concepts.

FIG. 8 is a circuit diagram illustrating an address storing table of the address control circuit of FIG. 7 according to some embodiments of the inventive concepts.

Referring to FIG. 8, the address storing table 420a may be implemented an anti-fuse array including a plurality of anti-fuses 422. The anti-fuses 422 may have electrical characteristics that are opposite to those of fuse elements. For example, the anti-fuses 422 may be resistive fuse elements that have a relatively high resistance value when they are not programmed and a relatively low resistance value when they are programmed.

In general, each anti-fuse 422 may have a dielectric between conductors. Ones of the anti-fuses 422 may be programmed by applying a relatively high voltage via the conductors disposed at both ends thereof to destroy the dielectric between the conductors. By programming the anti-fuses 422, the conductors disposed at both ends in each of the anti-fuses 422 may be short-circuited to cause the anti-fuses 422 to have a relatively low resistance value in some embodiments, each of the anti-fuses 422 may include a depletion-type MOS transistor in which a source 4222 and a drain 4223 are connected. At an initial stage, a resistance value between a first node 4224 connected to a gate electrode 4221 and a second node 4225 that is commonly connected to the source 4222 and the drain 4223 may be relatively high (e.g., very high) since the first node 4224 and the second node 4225 are separated by a gate oxide film. Thus, current flow between the first node 4224 and the second node 4225 may be suppressed and/or prevented. For example, this state may be set to be logic 'low', which may refer to a non-programmed state.

The anti-fuses 422 may irreversibly transition from an 'on' state to an 'off' state by applying a break-down voltage between the first node 4224 and the second node 4225 to destroy the gate oxide film. When the gate oxide film is destroyed, the resistance value between the first node 4224 and the second node 4225 may be lowered. For example, this state may be set to be logic 'high', which may refer to a programmed state. The address, storing table 420a may store the fail row address FRA, the fail column address FCA and the mapped column address MCA by selectively programming the anti-fuses 422.

The sensing unit 425a may include first through third sub sensing units 4251, 4252 and 4253 coupled respectively to the first through third storing units 421, 425 and 427. Each of the first through third sub sensing units 4251, 4252 and 4253 may be implemented with an NMOS transistor. Therefore, the sensing unit 425a may provide the fail row address FRA to the first comparator 430a, may provide the fail column address FCA to the second comparator 435a and may provide the mapped column address to the first selection circuit 443a, in response to the pointer signal TPS.

Figure 9:
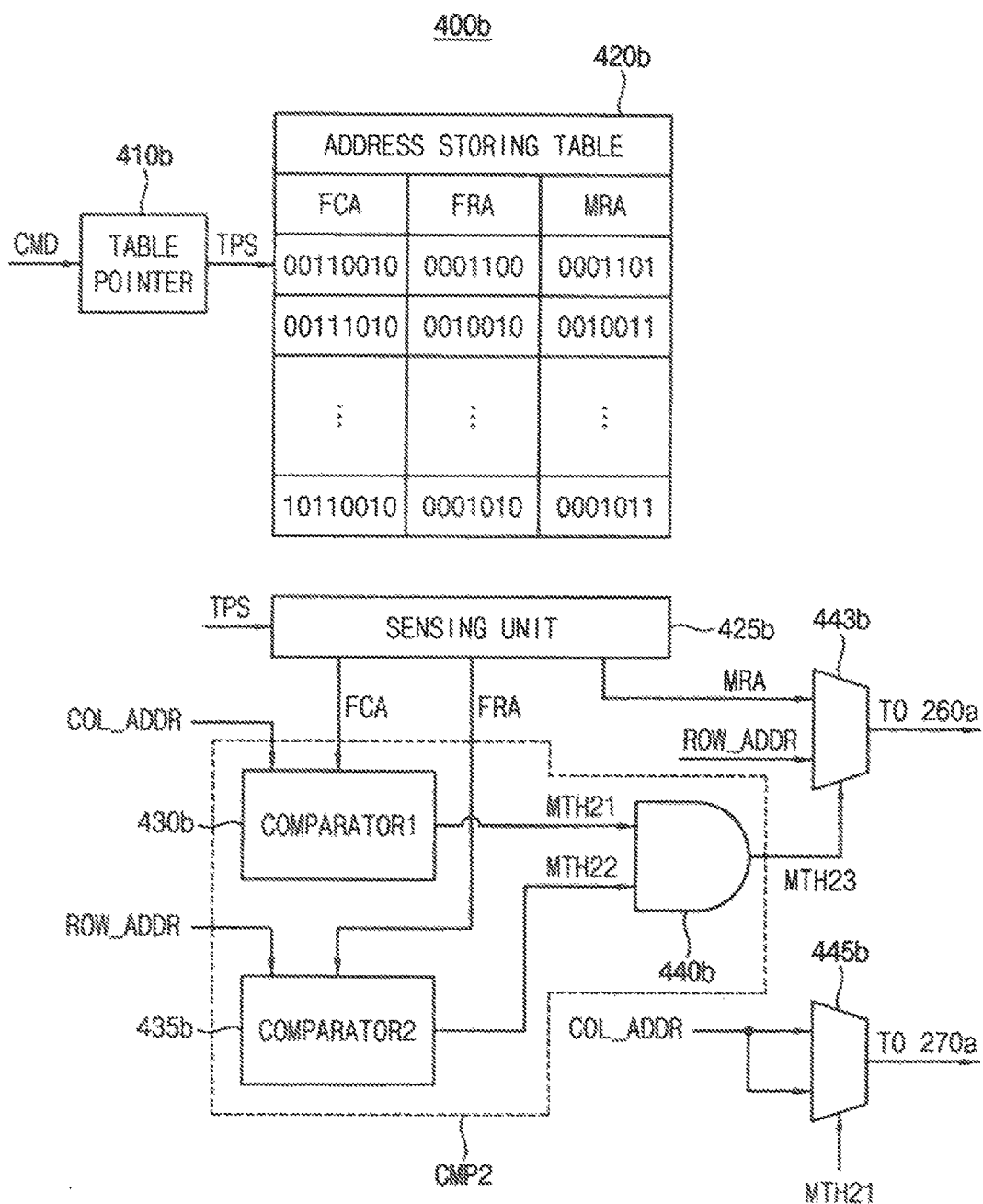
FIG. 9 is a circuit diagram illustrating an address control circuit of the semiconductor memory device of FIG. 3 according to some embodiments of the inventive concepts.

FIG. 9 is a circuit diagram illustrating an address control circuit of the semiconductor memory device of FIG. 3 according to some embodiments of the inventive concepts.

Referring to FIG. 9, an address control circuit 400b may include a table pointer 410b, a nonvolatile storage 420b, a sensing unit 425b, a comparator circuit CMP2, a first selection circuit 443b and a second selection circuit 445b. The nonvolatile storage 420b may be referred to as an address storing table.

Configuration and operation of the address control circuit 400b of FIG. 9 may be similar to the configuration and operation of the address control circuit 400b described above with respect to FIG. 7 except for the differences described below. Reference numerals the same as or similar to those described with respect to the foregoing figures may represent the same or similar elements, and descriptions thereof may be omitted or briefly described in the following description in order to simplify the description.

The comparator circuit CMP2 may include a first comparator 430b, a second comparator 435b and an AND gate 440b. The first comparator 430b may compare the fail column address FCA and the column address COL_ADDR and may output a first match signal MTH21 indicating whether the fail column address FCA and the column address COL_ADDR are same. The second comparator 435b may compare the fail row address FRA and the row address ROW_ADDR and may output a second match signal MTH22 indicating whether the fail row address FRA and the row address ROW_ADDR are same. The AND gate 440b may perform an AND operation on the first match signal MTH21 and the second match signal MTH22 to output a third match signal MTH23. The first selection circuit 443b may output one of the mapped row address MRA and the row address ROW_ADDR in response to the third match signal MTH23 to the first row decoder 260a. The second selection circuit 445b may output the column address COL_ADDR in response to the first match signal MTH21 to the first column decoder 270a.

Therefore, the first selection circuit 443b may output the mapped row address MRA to the first row decoder 260a when the fail row address FRA and the row address ROW_ADDR are same and the fail column address FCA and the column address COL_ADDR are same. Otherwise, the first selection circuit 443a may output the column address COL_ADDR to the first column decoder 270a.

When the first selection circuit 443b outputs the mapped row address MRA to the first row decoder 260a, the first row decoder 260a may select a memory cell in a memory cell row designated by the mapped row address MCA instead of a memory cell in a memory cell row designated by the fail row address FRA. Therefore, the first unit of memory cells may include fail cells within the error correction capability of the ECC engine because memory locations of the fail cells are distributed in a physical address region.

Figure 10:
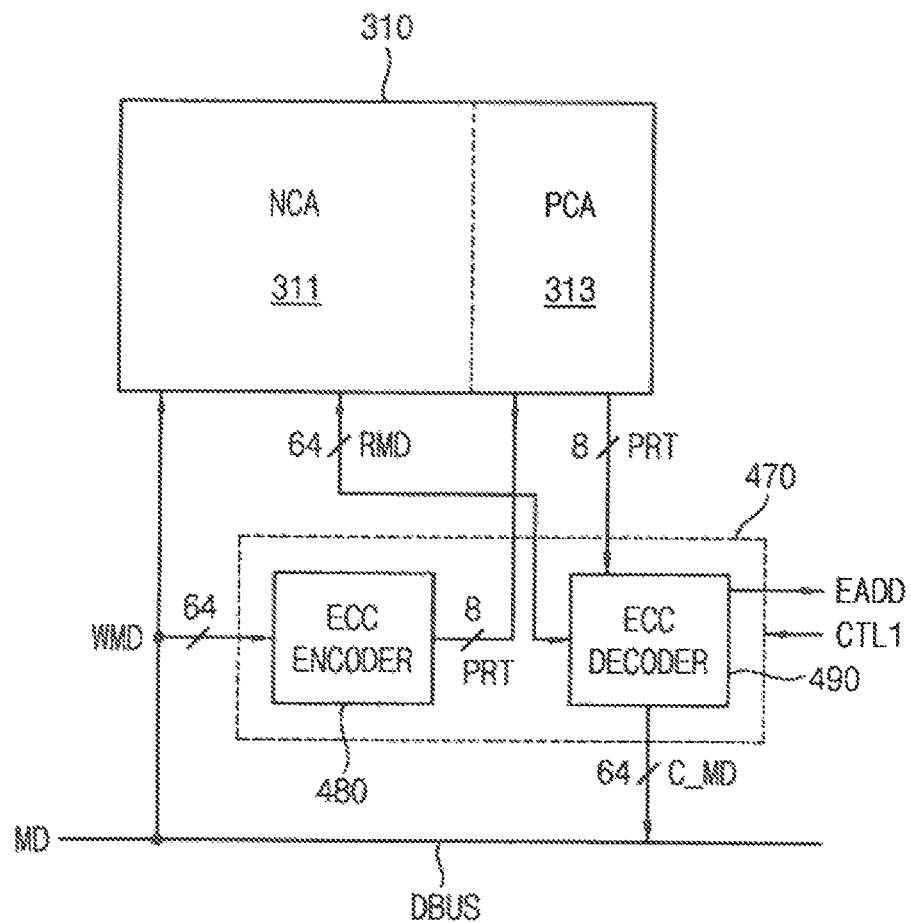
FIG. 10 illustrates an ECC engine of the semiconductor memory device of FIG. 3 according to some embodiments of the inventive concepts.

FIG. 10 illustrates an ECC engine of the semiconductor memory device of FIG. 3 according to some embodiments of the inventive concepts.

Referring to FIG. 10, the ECC engine 470 may perform an ECC operating for correcting an error bit included in the data read from or to be written to the first unit of memory cells.

A first unit of data bits may be set as, for example, 8 bits, 16 bits, 32 bits, 64 bits, or 128 bits, etc. In FIG. 10, the first unit of data bits is illustrated as being set as 64 bits.

The ECC engine 470 may include an ECC encoder 480 and an ECC decoder 490. The ECC encoder 480 may generate parity bits PRT related to write data WMD that is to be written in memory cells of the first bank array 310. The parity bits PRT may be stored in a second region 313 of the first bank array 310. The write data WMD may be stored in a first region 311 of the first bank array 310.

The ECC decoder 490 may correct an error bit included in read data RMD by using the read data RMD read from the first region 311 and the parity bits PRT read from the second region 313, and output error corrected data C_MD to a data bus DBUS. When the first unit of read data RMD includes additional error bit which the ECC engine can detect but cannot correct, the ECC decoder 490 may provide an address of the read data RMD to the control logic circuit 210 or the memory controller 100 as an error address EADD. The control logic circuit 210 or the memory controller 100 may store the error address EADD in the address storing table 420a additionally, and may store addresses of memory cells to swap the additional fail cells in the address storing table 420a as the mapping addresses considering distributions of the fail cells.

Figure 11A:
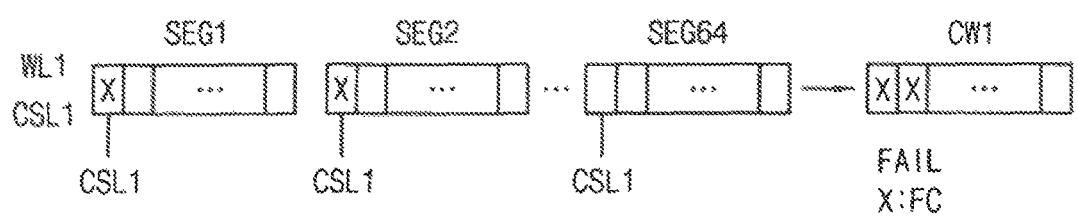
FIGS. 11A and 11B illustrate ECC operations when an address mapping according to some embodiments of the inventive concepts is not used.
Figure 11B:
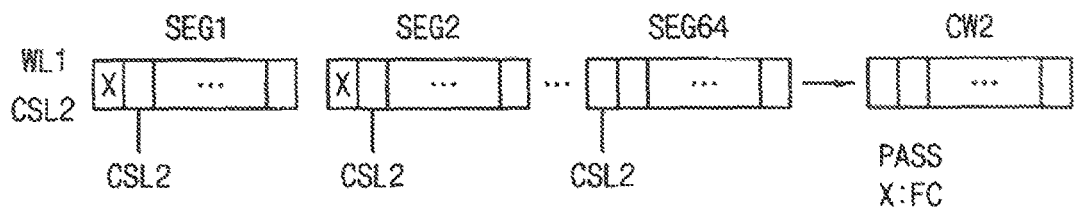
Figure 12A:
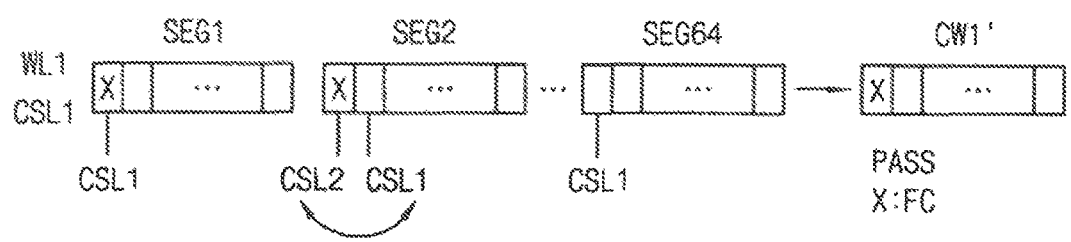
FIGS. 12A and 12B illustrate ECC operations when an address mapping according to some embodiments of the inventive concepts is used.
Figure 12B:
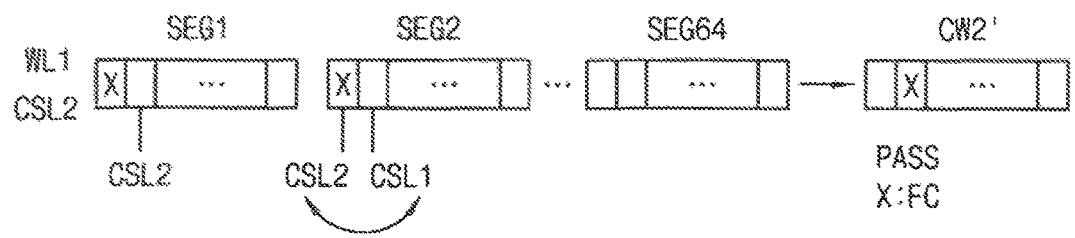

FIGS. 11A and 11B illustrate ECC operations when an address mapping according to some embodiments of the present inventive concepts is not used and FIGS. 12A and 12B respectively illustrate ECC operations when the address mapping according to some embodiments of the present inventive concepts is used.

In FIGS. 11A through 12B, segments SEG1~SEG64 of memory cells in a memory cell row coupled to a first word-line WL1 include memory cells that are simultaneously selected in response to each of first and second column selection signals CSL1 CSL2 in each of the segments SEG1~SEG64. In FIGS. 11A through 12B, X denotes a fail cell (FC). In addition, for the sake of illustration, is assumed that the ECC engine 470 may only correct 1-bit errors.

In FIG. 11A, a codeword CW1 selected by the first column selection signal CSL1 includes two fail cells, which exceeds the error correction capability of the ECC engine 470.

In FIG. 11B, a codeword CW2 selected by the second column selection signal CSL2 includes no fail cells.

Referring to FIGS. 12A and 12B, an address of the fail cell in the segment SEG2, which is selected by the first selection column signal SIG1 may be mapped such that the fail cell in the segment SEG2 is selected by the second column selection signal CSL2 as described with reference to FIG. 7. Therefore, a codeword CW1' selected by the first column selection signal CSL1 may include one fail cell, a codeword CW2' selected by the second column selection signal CSL2 may include one fail cell and each of the codewords CW1' and CW2' may include only one fail cell which is within the error correction capability of the ECC engine 470. In FIGS. 12A and 12B, the mapped address is an address of the memory cell selected by the second column selection signal CSL2.

Figure 13A:
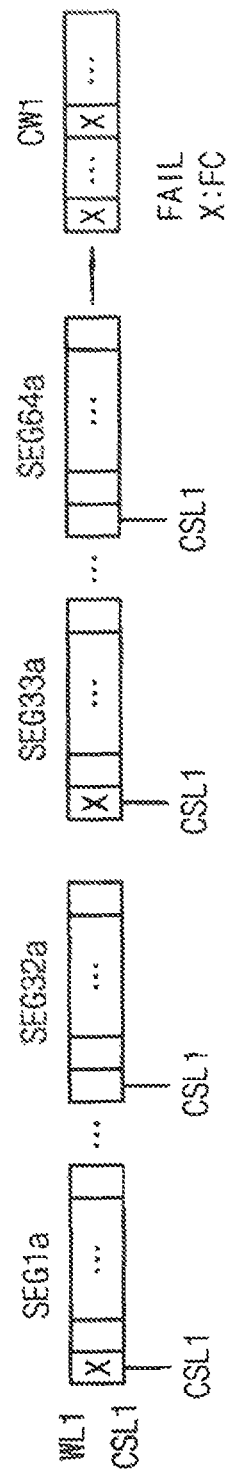
FIGS. 13A and 13B illustrate ECC operations when an address mapping according to some embodiments of the inventive concepts is not used.
Figure 13B:
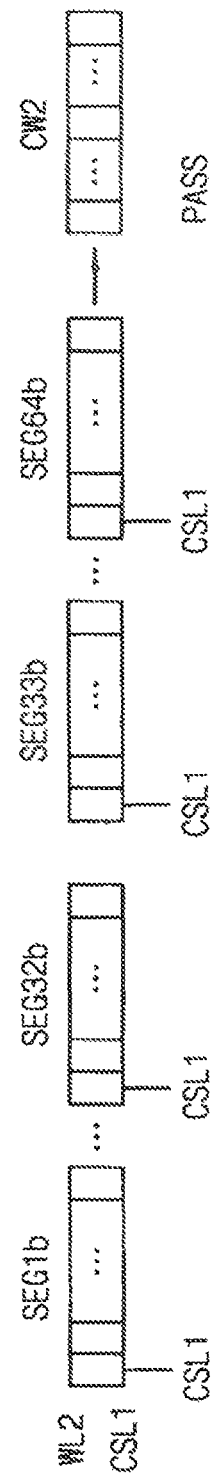
Figure 14A:
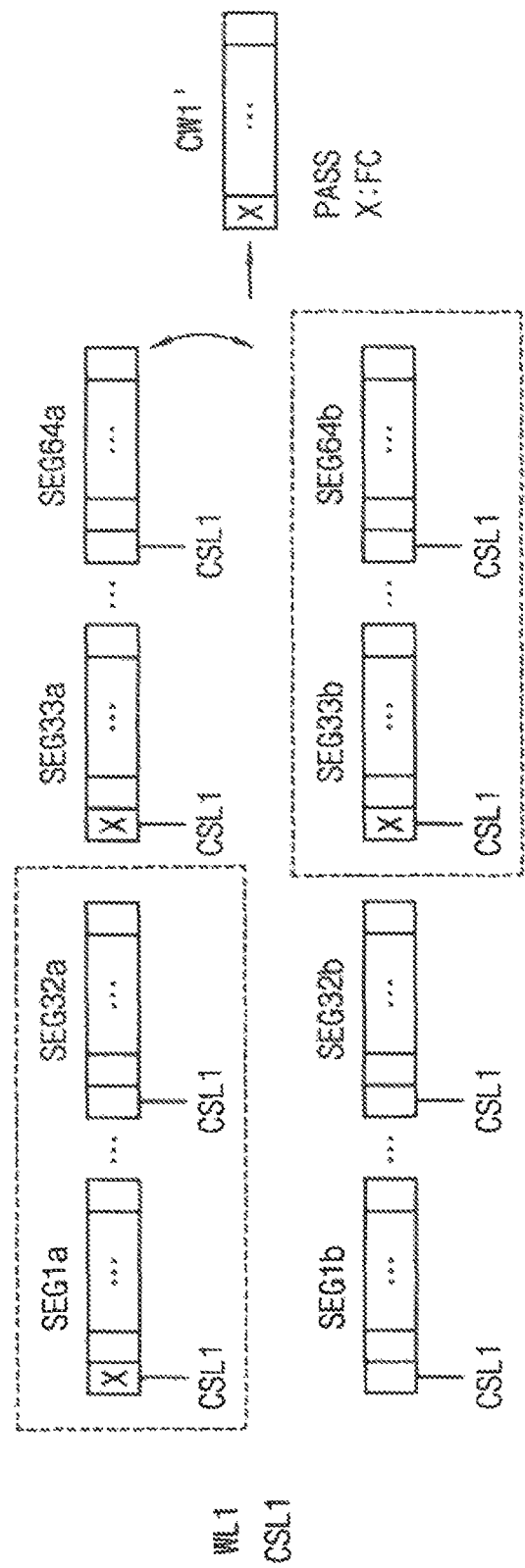
FIGS. 14A and 14B illustrate ECC operations when an address mapping according to some embodiments of the inventive concepts is used.
Figure 14B:
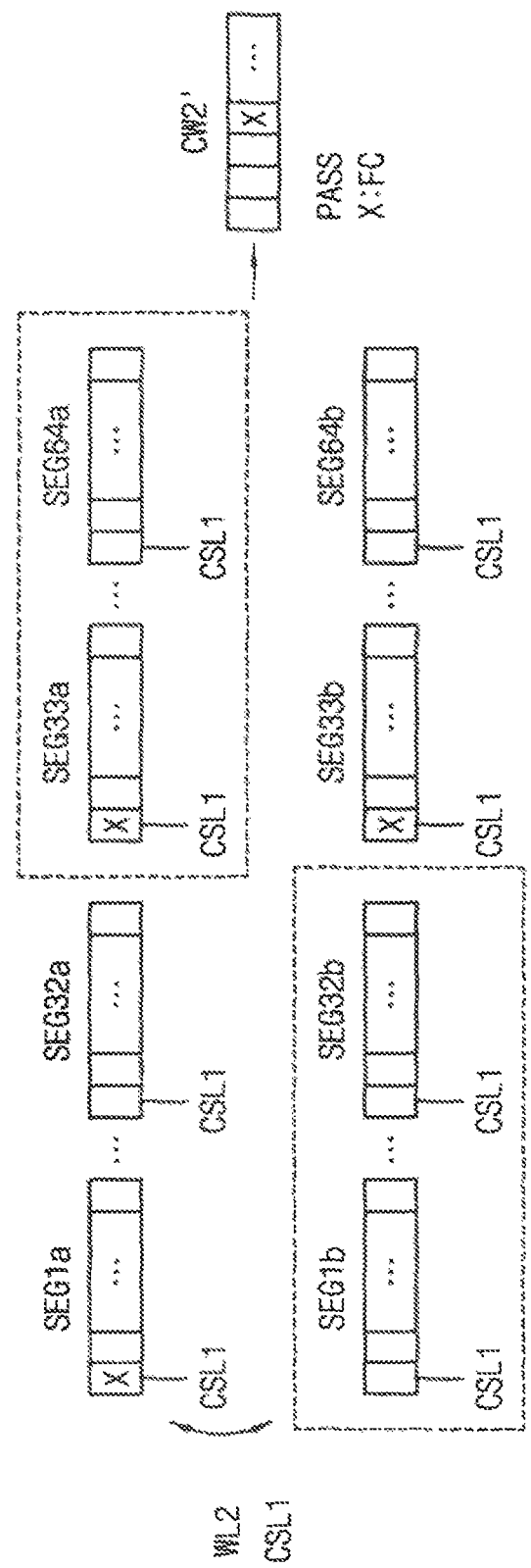

FIGS. 13A and 13B illustrate ECC operations when an address mapping according to some embodiments of the present inventive concept is not used and FIGS. 14A and 14B illustrate ECC operations when the address mapping according to some embodiments of the present inventive concept is used.

In FIGS. 13A through 14B, there are illustrated segments SEG1a~SEG64a of memory cells in a first memory cell row coupled to a first word-line WL1 and segments SEG1b~SEG64b of memory cells in a second memory cell row coupled to a second word-line WL2 include memory, cells that are simultaneously selected in, response to the first column selection signal CSL1 in the segments SEG1a~SEG64a and the segments SEC1b~SEG64b. In FIGS. 13A through 14B, X denotes a fail cell (FC). In addition, for the sake of illustration, it is assumed that the ECC engine 470 may correct only 1-bit errors.

In FIG. 13A, a codeword CW1 in the first memory cell row and selected by the first column selection signal CSL1 includes two fail cells, which exceeds the error correction capability of the ECC engine 470. In FIG. 13B, a codeword CW2 in the second memory cell row and selected by the first, column selection signal CSL1 includes no fail cells.

Referring to FIGS. 14A and 14B, an address of the fail cell in the segments SEG1a~SEG32a, which is selected by the first word-line WL1 may be mapped such that the fail cell in the segments SEG1a~SEG32a is selected by the second word line WL2 as described with reference to FIG. 9. Therefore, when the first word-line WL1 is activated, a codeword CW1' selected by the first column selection signal CSL1 may include only one fail cell, a codeword CW2' selected by the first column selection signal CSL2 may include only one fail cell and each of the codewords CW1' and CW2' may include only one fail cell, which is within the error correction capability of the ECC engine 470. In FIGS. 14A and 14B, the mapped address is a row address of the memory cell in the second memory cell row different from the first memory cell row which is selected by the first column selection signal CSL1.

In FIGS. 12A, 12B, 14A and 14B, the mapping information may be stored during test process considering distribution of the fail cells or may be randomly stored without regard to distribution of the fail cells. When the mapping information, is randomly stored in the nonvolatile storage without regard to distribution of the fail cells, a probability that a number of the fail cells in the first unit of memory cells exceed the error correction capability may be reduced.

Figure 15A:
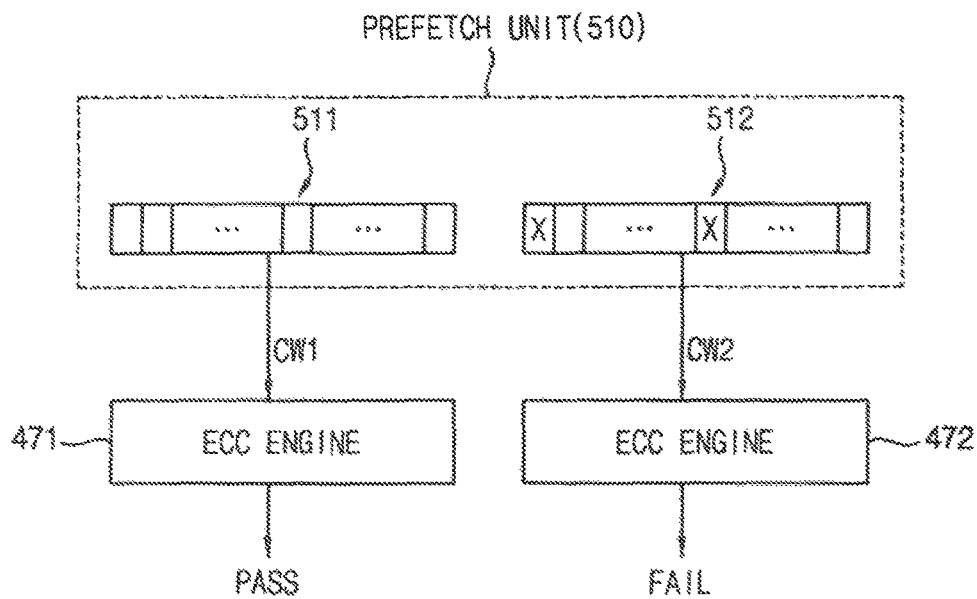
FIG. 15A illustrates an operation when a data rearrangement according to some embodiments of the inventive concepts is not employed.
Figure 15B:
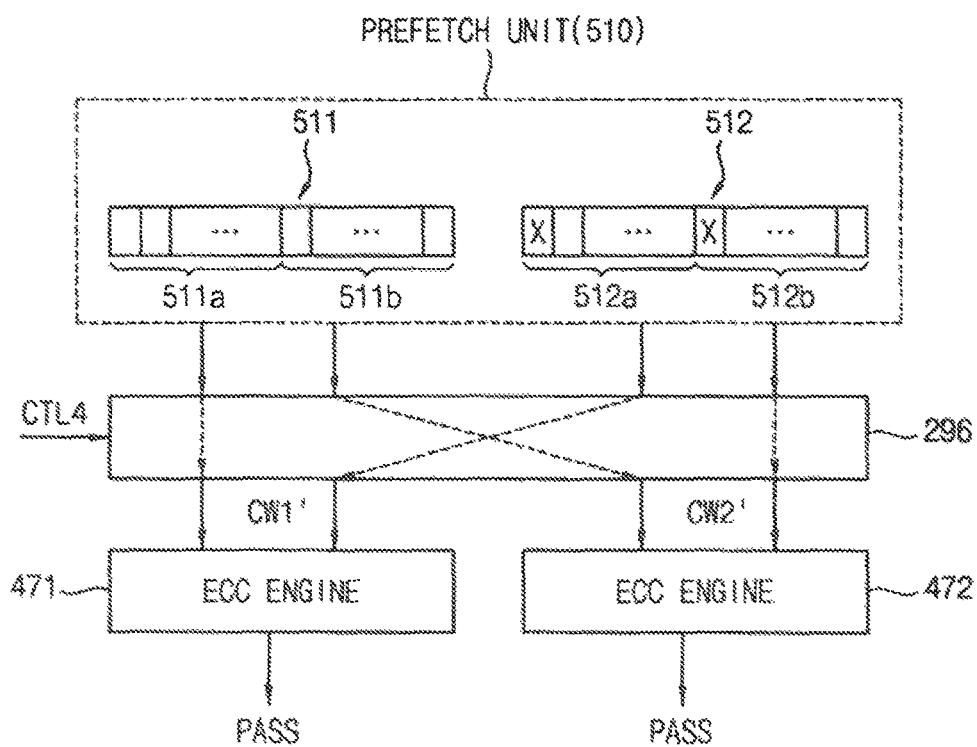
FIG. 15B illustrates an operation when a data rearrangement according to some embodiments of the inventive concepts is employed.

FIG. 15A illustrates an operation when a data rearrangement according to some embodiments of the present inventive concepts is not employed and FIG. 15B illustrates an operation when the data rearrangement according to some embodiments of the present inventive concept is employed.

Referring to FIG. 15A, a second unit of data 510 may include at least two first units of data 511 and 512. The first unit of data 511 as a first codeword CW1 may be provided to a first ECC engine 471 and the first unit of data 512 as a second codeword CW2 may be provided to a second ECC engine 472 without performing data rearrangement. The first unit of data 511 may include no fail cells and the first unit of data 512 may include two fail cells, which exceeds the error correction capability of the second EEC engine 472. Therefore, the second ECC engine 472 may determine the second codeword CW2 as 'fail'.

Referring to FIG. 15B, a cross-bar switch 296 may rearrange at least two first units of data 511 and 512 in a second unit of data 510 in response to a control signal CTL4 from the control logic circuit 210. The cross-bar switch 296 may swap a first section 511a of the first unit 511 with a first section 512a of the first unit 512. The control logic circuit 210 may provide the control signal CTL4 to the cross-bar switch 296 based on the mapping information stored in the nonvolatile storage 420. The cross-bar switch 296 may be disposed between the data I/O buffer 295 and the ECC engine 470 or between the I/O gating circuit 290 and the ECC engine 470 in FIG. 3. The mapping information may be stored during test process considering distribution of the fail cells or may be randomly stored without regard to distribution of the fail cells. When the mapping information is randomly stored in the nonvolatile storage without regard to distribution of the fail cells, a probability that a number of the fail cells in the first unit of memory cells exceed the error correction capability may be reduced.

The first codeword CW1' provided to the first ECC engine 471 may include the first section 511a of the first unit of data 511 and the first section 512a of the first unit of data 512. Since the first codeword CW1' may include one fail cell, the first ECC engine 471 may determined the first codeword CW1' as 'pass'. The second code-word CW2' provided to the second ECC engine 472 may include the second section 511b of the first unit of data 511 and the second section 512b of the first unit of data 512. Since the second codeword CW2' may include one fail cell, the second ECC engine 472 may determine the second codeword CW2' as 'pass'.

Figure 16:
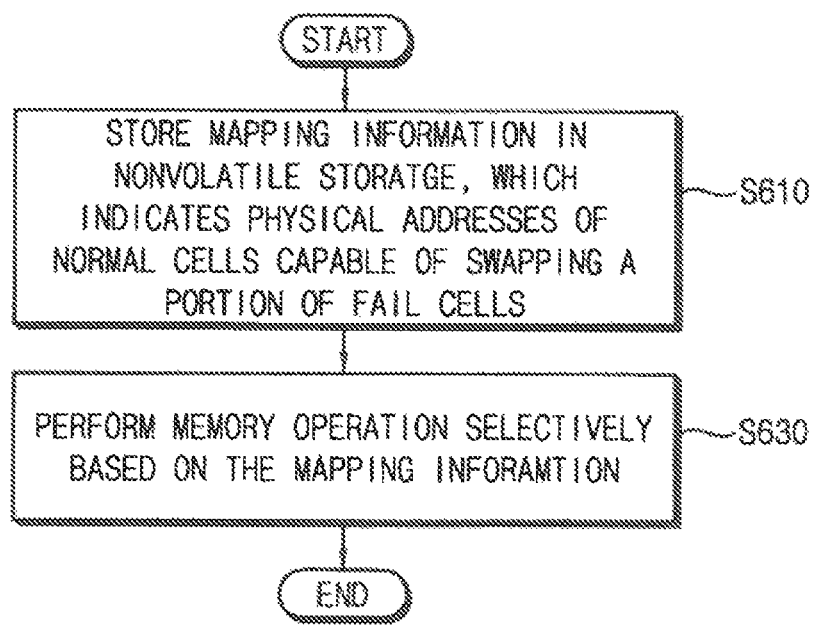
FIG. 16 is a flow chart illustrating methods of operating semiconductor memory devices according to some embodiments of the inventive concepts.

FIG. 16 is a flow chart illustrating methods of operating semiconductor memory devices according to some embodiments of the inventive concepts.

Referring to FIGS. 3 through 14B and 16, in a method of operating a semiconductor memory device which includes a memory cell array 300 having a plurality of memory cells and an ECC engine 470 to perform an error correction operation on data of the memory cell array 300, a mapping information may be stored in a nonvolatile storage 420 for one or more first units of memory cells that include a number of the fail cells an exceeding error correction capability of the ECC engine 470 (S610). The mapping information may indicate a physical address of normal cells to swap a portion of the fail cells and the first unit of memory cells may be accessed based on a logical address. A memory operation may be performed on the memory cell array selectively based on the mapping information (S630).

Figure 17:
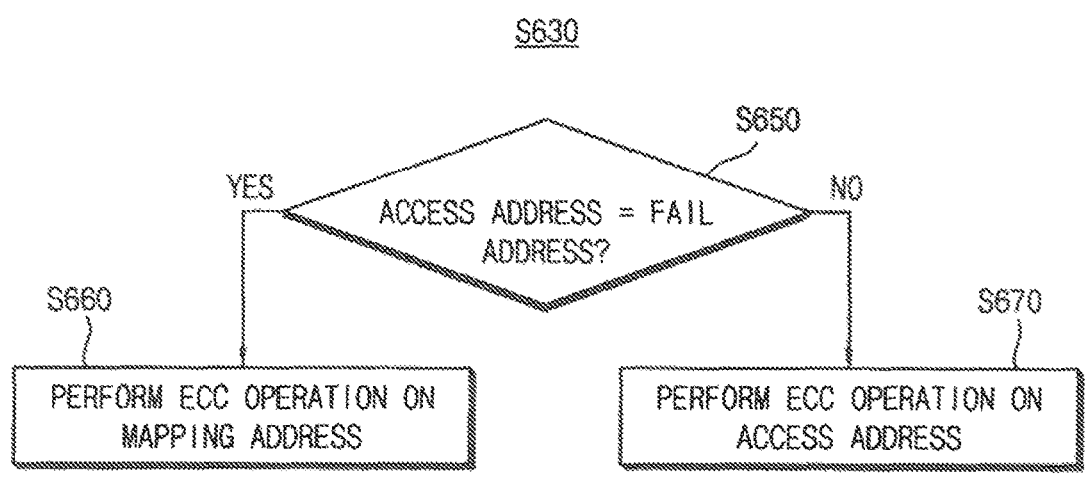
FIG. 17 is a flow chart illustrating some operations of the methods of operating semiconductor memory devices of FIG. 16 according to some embodiments of the inventive concepts.

FIG. 17 is a flow chart illustrating some operations of the methods of operating semiconductor memory devices of FIG. 16 according to some embodiments of the inventive concepts.

Referring to FIGS. 3 through 14B and 17, for performing the memory operation (S630), the address control circuit 400 may determine whether an access address and a fail address is the same (S650). When the access address and the fail address is the same (YES in S650), the ECC engine 470 may perform an ECC operation on the memory cell array 300 based on the mapped address (S660). When the access address and the fail address is not the same (NO in S650), the ECC engine 470 may perform an ECC operation on the memory cell array 300 based on the access address (S670).

According to some embodiments, in a method of operating the semiconductor memory device 200a, when a first unit of memory cells include a number of the fail cells exceeding error correction capability of the ECC engine 470, a portion of the fail cells may be mapped to physical addresses of normal cells and ECC operation may be performed according to a mapping information indicating a relation between the fail addresses of the fail cells and the physical addresses of normal cells such that the first unit of memory cells includes a quantity of fail cells that is within the error correction capability of the ECC engine 470. Performance of the semiconductor memory device 200a may be enhanced because the fail cells may be repaired to within the error correction capability without including extra redundancy cells.

Figure 18:
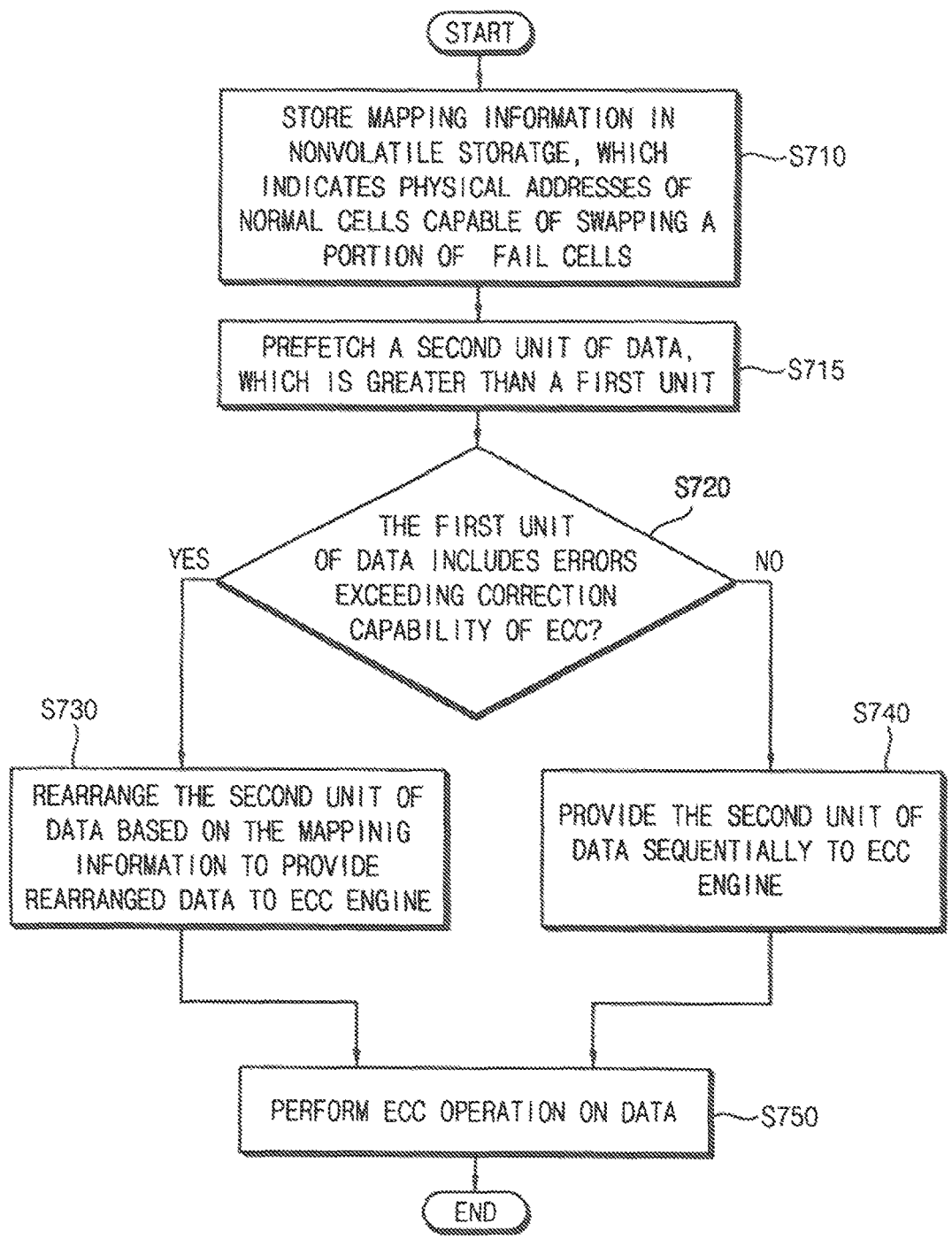
FIG. 18 is a flow chart illustrating methods of operating semiconductor memory devices according to some embodiments of the inventive concepts.

FIG. 18 is a flow chart illustrating methods of operating semiconductor memory devices according to some embodiments of the inventive concepts.

Referring to FIGS. 3 through 10, 15B and 18, in a method of operating a semiconductor memory device which includes a memory cell array 300 having a plurality of memory cells and an ECC engine 470 to perform an error correction operation, on data of the memory cell array 300, a mapping information may be stored in a nonvolatile storage 420 for one or more first units of memory cells that include a number of the fail cells exceeding error correction capability of the ECC engine 470 (S710). The mapping information may indicate a physical address of normal cells to swap a portion of the fail cells and the first unit of memory cells may be accessed based on a logical address. A second unit of data may be prefetched (S715). The second unit may be greater than the first unit. It may be determined whether at least one first unit of data includes errors exceeding the error correction capability of the ECC engine 470 based on the mapping information (S720). In some embodiments, it may be determined whether the mapping information includes at least one logical address corresponding to at least one of the first units of data. When the at least one first unit of data includes errors exceeding the error correction capability of the ECC engine 470 (YES in S720), the second unit of data may be rearranged based on the mapping information such that each of the first units of data includes errors within the error correction capability of the ECC engine 470 to provide at least two first units of data to the ECC engine (S730). When the at least one first unit of data does not include errors exceeding the error correction capability of the ECC engine 470 (NO in S720), the second unit of data may be sequentially provided to the ECC engine 470 (S740). The ECC engine 470 may perform a memory operation on the at least two first units of data (S750).

As described above, the first unit may correspond to a codeword unit of the semiconductor memory device 200a and the second unit may correspond to a prefetching unit of the semiconductor memory device 200a. The mapping information may include fail addresses of a portion of the fail cells and mapping addresses to be mapped with the fail addresses. The mapping information may be stored in the nonvolatile storage 420 considering a distribution of the fail cells or may be randomly stored in the nonvolatile storage 420 without regard to the distribution of the fail cells.

According to some embodiments, in methods of operating the semiconductor memory device 200a, data may be rearranged based on the mapping information to constitute codewords such that the fail cells may be distributed in physical codewords. Performance of the semiconductor memory device 200a may be enhanced because the fail cells may be repaired to within an error correction capability without including extra redundancy cells.

Figure 19:
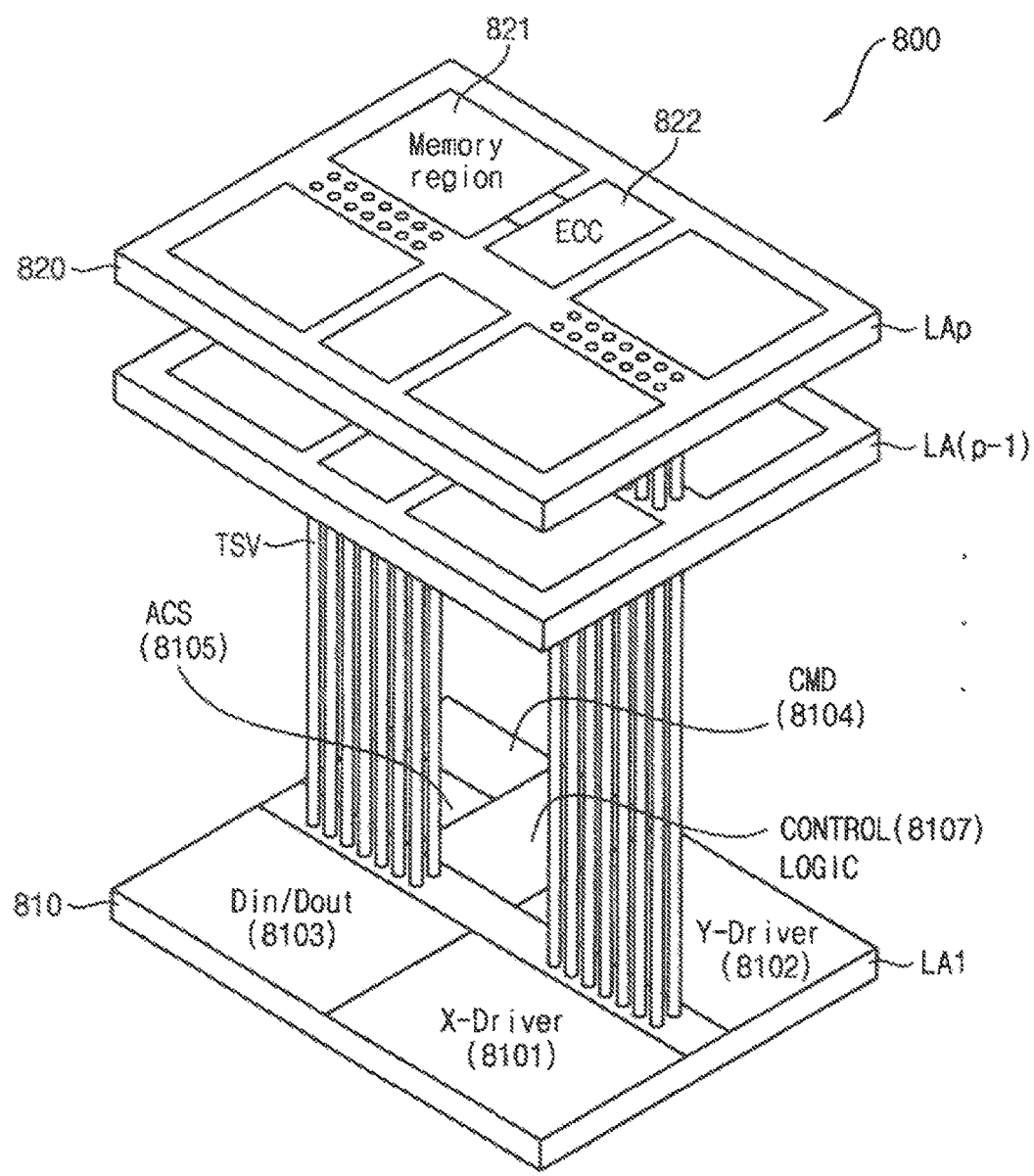
FIG. 19 is a structural block diagram illustrating a semiconductor memory device according to some embodiments of the inventive concepts.

FIG. 19 is a structural block diagram illustrating a semiconductor memory device according to some embodiments of the inventive concepts.

Referring to FIG. 19, a semiconductor memory device 800 may include first through p-th semiconductor integrated circuit layers LA1 through LAp (p being a natural number greater than two), in which the first semiconductor integrated circuit layer LA1, which may be a lowermost one of the first through p-th semiconductor integrated circuit layers LA1 through Lap, may be an interface or control chip and ones of the semiconductor integrated circuit layers LA2 through LAp may be slave chips including core memory chips. The first through p-th semiconductor integrated circuit layers LA1 through LAp may transmit and receive signals therebetween through, for example, through-silicon-vias (TSVs). The first semiconductor integrated circuit layer LA1, as the interface or control chip, may communicate with an external memory controller through a conductive structure formed on an external surface. A description will be made regarding structure and an operation of the semiconductor memory device 800 by mainly using the first semiconductor integrated circuit layer LA1, or 810, as the interface or control chip and the p-th semiconductor integrated circuit layer LAp, or 820, as the slave chip.

The first semiconductor integrated circuit layer 810 may include various peripheral circuits for driving a memory region 821 provided in the p-th semiconductor integrated circuit layer 820. For example, the first semiconductor integrated circuit layer 810 may include a row (X)-driver 8101 for driving word-lines of a memory, a column (Y)-driver 8102 for driving bit-lines of the memory, a data input/output unit (Din/Dout) 8103 for controlling input/output of data, a command buffer (CMD) 8104 for receiving a command CMD from outside and buffering the command CMD, and an address control circuit (ACS) 8105 for receiving an address from outside and mapping address of a fail cell. The address, control circuit 8105 may employ, for example, the address control circuit 400a of FIG. 7.

The first semiconductor integrated circuit layer 810 may further include a control logic circuit 8107. The control logic circuit 8107 may access the memory region 821 and may generate control signals for accessing the memory region 821 based on the command from the memory controller.

The p-th semiconductor integrated circuit layer 820 may include the memory region 821 an EEC engine 822 that performs ECC encoding and ECC decoding on data of the memory region 821, and a peripheral region in which peripheral circuits such as a row decoder, a column decoder, and a bit line sense amplifier are disposed for writing/reading data in the memory region 821.

As described with reference to FIGS. 3 through 18, the address control, circuit 8105 may include a nonvolatile storage to store a mapping information indicating physical addresses of normal cells to swap a portion of fail cells when a first unit of memory cells includes a number of fail cells exceeding an error correction capability of the ECC engine 822. Therefore, the semiconductor memory device 800 may perform ECC operation or data rearrangement such that the fail cells are distributed in physical codewords. Accordingly, performance of the semiconductor memory device 800 may be enhanced because the fail cells are repaired without including extra redundancy cells.

In addition, in some embodiments, a three dimensional (3D) memory array may be provided in semiconductor memory device 800. The 3D memory array may be monolithically formed in one or more physical levels of arrays of memory cells having an active area disposed above a silicon substrate and circuitry associated with the operation of those memory cells, whether such associated circuitry is above or within such substrate. The term "monolithic," as used herein, means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 20:
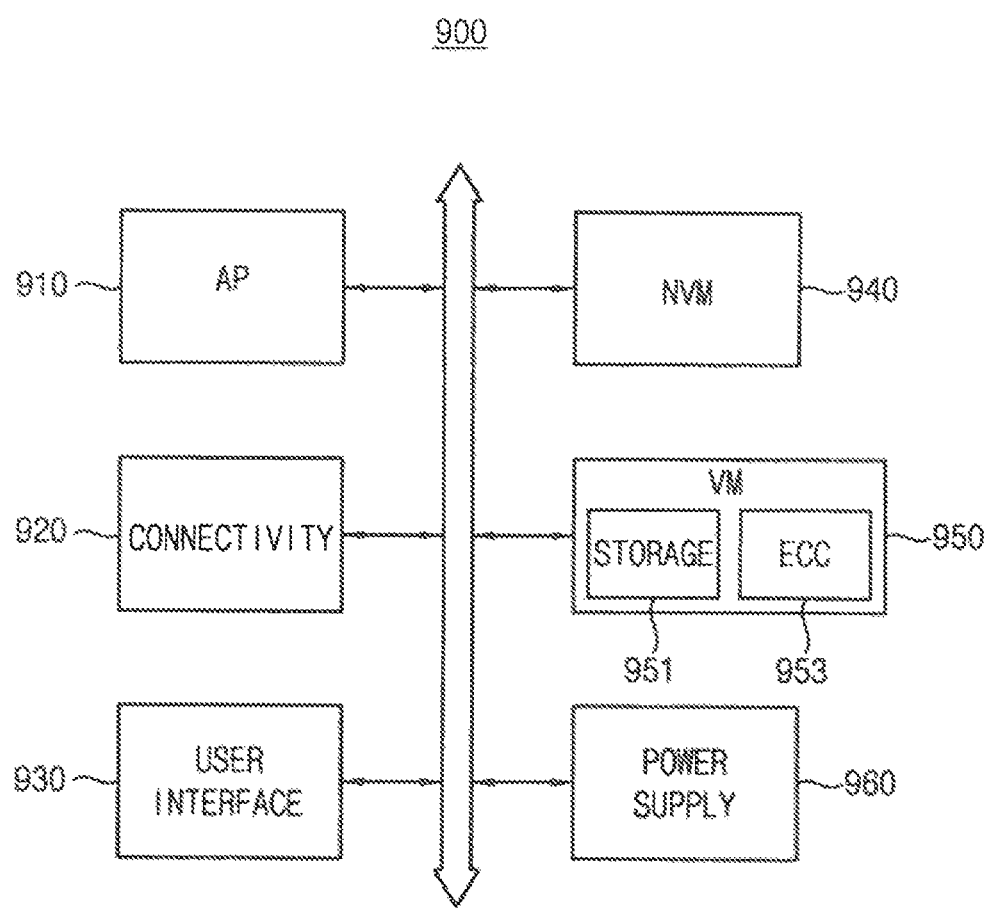
FIG. 20 is a block diagram illustrating a mobile system including a semiconductor memory device according to some embodiments of the inventive concepts.

FIG. 20 is a block diagram illustrating a mobile system including a semiconductor memory device according to some embodiments of the inventive concepts.

Referring to FIG. 20, a mobile system 900 may include an application processor 910, a connectivity unit 920, a semiconductor memory device 950, a nonvolatile memory device 940, a user interface 930 and a power supply 960.

The application processor 910 may execute applications, such as a web browser, a game application, a video player, etc. The connectivity unit 920 may perform wired or wireless communication with an external device. The semiconductor memory device 950 may store data processed by the application processor 910 or operate as a working memory. The semiconductor memory device 950 may employ the semiconductor memory device 200a of FIG. 3. The semiconductor memory device 950 may include a nonvolatile storage 951 and an ECC engine 953.

The nonvolatile memory device 940 may store a boot image for booting the mobile system 900. The user interface 930 may include at least one input device, such as a keypad, a touch screen, etc., and at least one output device, such as a speaker, a display device, etc. The power supply 960 may supply a power supply voltage to the mobile system 900.

In some embodiments, the mobile system 900 and/or components of the mobile system 900 may be packaged in various forms.

As described above, the semiconductor memory device 950 may perform ECC operation or data rearrangement based on the mapping information such that the fail cells are distributed in physical codewords. Accordingly, performance of the semiconductor memory device 950 may be enhanced because the fail cells are repaired without including extra redundancy cells.

The present disclosure may be applied to systems using semiconductor memory devices. The present disclosure may be applied to systems such as be a mobile phone, a smart phone, a personal digital, assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of some embodiments and is not to be construed as limiting thereof. Although some embodiments have been described, those skilled in the art will readily appreciate that many modifications are possible in some embodiments without materially departing from the novel teachings and advantages of the present disclosure. Accordingly, all such modifications are intended to be included within the scope of the present disclosure as defined in the claims.

What is claimed is:

1. A method of operating a semiconductor memory device including a memory cell array and an error correction code (ECC) engine, wherein the memory cell array includes a plurality of memory cells and the ECC engine is configured to perform an error correction operation on data of the memory cell array, the method comprising:
storing, in a nonvolatile storage, a mapping information indicating physical addresses of normal cells to swap with a portion of fail cells when a unit of memory cells, of the plurality of memory cells, includes a number of the fail cells exceeding an error correction capability of the ECC engine, wherein the unit of memory cells is accessed based on a logical address, and wherein a codeword of the unit of memory cells comprises the number of the fail cells exceeding the error correction capability of the ECC engine;
rearranging data in the codeword to reduce the number of the fail cells in the codeword; and
performing a memory operation on the memory cell array selectively based on the mapping information.

2. The method of claim 1, wherein the mapping information is stored in the nonvolatile storage based on a test of the plurality of memory cells performed during a fabrication process of the semiconductor memory device.

3. The method of claim 1, wherein the mapping information is stored in the nonvolatile storage based on setting a mode register included in the semiconductor memory device.

4. The method of claim 1, wherein the mapping information is stored in the nonvolatile storage based on a physical distribution of the fail cells.

5. The method of claim 1, wherein the mapping information is randomly stored in the nonvolatile storage without regard to a physical distribution of the fail cells.

6. The method of claim 1, wherein performing the memory operation comprises:
determining whether an access address for accessing the memory cell array is the same as an address included in the mapping information;
performing an ECC operation based on the mapping information when the access address is the same as the address stored in the mapping information; and
performing an ECC operation based on the access address when the access address is not stored in the mapping information.

7. The method of claim 6, wherein performing the ECC operation based on the mapping information comprises:
generating a parity data by performing an ECC encoding on main data received with the access address; and
storing the main data in a memory location of a first region of the memory cell array and storing the parity data in a second region of the memory cell array, wherein the memory location is designated by a mapping address included in the mapping information.

8. The method of claim 1, further comprising:
detecting an additional error exceeding the error correction capability of the ECC engine after performing an ECC decoding on data stored in the first unit of memory cells based on the mapping information;
storing, in the nonvolatile storage, an address of a memory cell associated with the additional error as an additional fail cell; and
storing, in the nonvolatile storage, a mapping address to swap with the additional fail cell based on a physical distribution of the fail cells.

9. The method of claim 1,
wherein the codeword comprises a first codeword of the semiconductor memory device, and
wherein rearranging the data comprises distributing one of the fail cells of the first codeword to a second codeword of the semiconductor memory device.

10. The method of claim 9,
wherein rearranging the data further comprises distributing a portion of data of the second codeword to the first codeword, and
wherein, after rearranging the data, the number of the fail cells exceeding the error correction capability of the ECC engine is absent from both the first codeword and the second codeword.

11. A semiconductor memory device comprising:
a memory cell array including a plurality of memory cells;
an error correction code (ECC) engine configured to perform an error correction operation on data of the memory cell array;
an address control circuit configured to store a mapping information indicating physical addresses of normal cells to swap with a portion of fail cells when a unit of memory cells, of the plurality of memory cells, includes a number of the fail cells exceeding an error correction capability of the ECC engine, wherein the unit of memory cells is accessed based on a logical address;

an address decoder configured to access the memory cell array selectively based on the mapping information;

a control logic circuit configured to control the ECC engine, the address control circuit and the address decoder in response to a command and an address provided from a device external to the semiconductor memory device;

wherein a codeword of the unit of memory cells corn rises the number of the fail cells exceeding the error correction capability of the ECC engine, and wherein the semiconductor memory device is configured to rearrange data in the codeword to reduce the number of the fail cells in the codeword.

12. The semiconductor memory device of claim 11, wherein the address control circuit comprises:
a nonvolatile storage configured to store fail addresses designating the portion of the fail cells and corresponding mapping addresses to swap with the fail addresses;
a comparator circuit configured to compare an access address for accessing the memory cell array with the fail addresses to generate a match signal indicating whether the access address is the same as one of the fail addresses; and
a selection circuit configured to output the access address or one of the mapping addresses in response to the match signal, the one of the mapping addresses corresponding to the access address.

13. The semiconductor memory device of claim 11, wherein when the unit of memory cells includes the number of the fail cells exceeding the error correction capability of the ECC engine,
a row address of a memory cell row including the first unit of memory cells is stored in a nonvolatile storage as a fail row address,
column addresses of the portion of the fail cells are stored in the nonvolatile storage as fail column addresses, and
column addresses of memory cells to swap the portion of the fail cells are stored in the nonvolatile storage as mapped column addresses.

14. The semiconductor memory device of claim 11, wherein:
the unit of memory cells are included in a first memory cell row designated by a first row address;
the unit of memory cells are simultaneously selected in response to a first column selection signal; and
the address control circuit is configured to output a mapped column address such that a different memory cell included in the first memory cell row is selected in response to a second column selection signal different from the first column selection signal when an access address is the same as a fail address of the mapping information.

15. The semiconductor memory device of claim 11, wherein:
the unit of memory cells are included in a first memory cell row designated by a first row address;
the unit of memory cells are simultaneously selected in response to a first column selection signal; and
the address control circuit is configured to output a mapped row address such that a memory cell included in a second memory cell row different from the first memory cell row is selected when an access address is the same as a fail address of the mapping information.

16. A method of operating a semiconductor memory device including a memory cell array and an error correction code (ECC) engine, wherein the memory cell array includes a plurality of memory cells and the ECC engine is configured to perform an error correction operation on data in the memory cell array, the method comprising:
storing, in a nonvolatile storage, a mapping information indicating a physical address of normal cells capable of swapping with a portion of fail cells when a first unit of memory cells includes a number of the fail cells exceeding an error correction capability of the ECC engine, wherein the first unit of memory cells of the memory cells is accessed based on a logical address;
prefetching a second unit of data from a second unit of memory cells, wherein the second unit of memory cells comprises a plural number of the first unit of memory cells;
re-arranging the second unit of data based on the mapping information such that each of first units of data included in the second unit of data includes no more than a number of errors within the error correction capability of the ECC engine;
providing the ECC engine with at least two of the first units of data of the second unit of data; and
performing, in the ECC engine, an ECC operation on the at least two of the first units of data.

17. The method of claim 16, wherein the first unit of memory cells corresponds to a codeword unit of the semiconductor memory device and the second unit of memory cells corresponds to a prefetching unit of the semiconductor memory device.

18. The method of claim 16, wherein:
the mapping information includes fail addresses of a portion of the fail cells and corresponding mapping addresses to swap with the fail addresses; and
the mapping information is stored in the nonvolatile storage through a test on the memory cells based on a distribution of the fail cells during a fabrication process of the semiconductor memory device.

19. The method of claim 16, wherein:
the mapping information includes fail addresses of a portion of the fail cells and corresponding mapping addresses to swap with the fail addresses; and
the mapping information is randomly stored in the nonvolatile storage without regard to a distribution of the fail cells.

* * * * *